United States Patent
Chakravadhanula et al.

(10) Patent No.: US 8,650,524 B1
(45) Date of Patent: Feb. 11, 2014

(54) METHOD AND APPARATUS FOR LOW-PIN COUNT TESTING OF INTEGRATED CIRCUITS

(71) Applicant: Cadence Design Systems, Inc., San Jose, CA (US)

(72) Inventors: Krishna Chakravadhanula, Vestal, NY (US); Vivek Chickermane, Ithaca, NY (US); Dale Meehl, Melbourne, FL (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/673,579

(22) Filed: Nov. 9, 2012

(51) Int. Cl.
*G06F 17/50* (2006.01)
(52) U.S. Cl.
USPC ............ 716/114; 716/106; 716/111; 716/136
(58) Field of Classification Search
USPC .................................. 716/106, 111, 114, 136
See application file for complete search history.

(56) References Cited

U.S. PATENT DOCUMENTS

| | | | | |
|---|---|---|---|---|
| 4,947,357 A * | 8/1990 | Stewart et al. | ................ | 714/726 |
| 5,448,525 A * | 9/1995 | Sturges | .......................... | 365/201 |
| 5,617,430 A * | 4/1997 | Angelotti et al. | ............. | 714/726 |
| 5,717,701 A * | 2/1998 | Angelotti et al. | ............... | 714/30 |
| 5,805,608 A * | 9/1998 | Baeg et al. | ..................... | 714/726 |
| 5,812,562 A * | 9/1998 | Baeg | .............................. | 714/726 |
| 5,898,704 A * | 4/1999 | Kawano | ........................ | 714/727 |
| 6,018,815 A * | 1/2000 | Baeg | .............................. | 714/726 |
| 6,631,504 B2 * | 10/2003 | Dervisoglu et al. | .......... | 716/136 |
| 6,686,759 B1 * | 2/2004 | Swamy | ..................... | 324/750.15 |
| 6,715,105 B1 * | 3/2004 | Rearick | ........................... | 714/30 |
| 6,925,583 B1 * | 8/2005 | Khu et al. | ......................... | 714/30 |
| 7,747,920 B2 * | 6/2010 | Wang et al. | ................... | 714/731 |
| 8,046,651 B2 * | 10/2011 | Whetsel | ........................ | 714/731 |
| 2012/0030532 A1 * | 2/2012 | Jain et al. | ...................... | 714/726 |

OTHER PUBLICATIONS

J. Moreau, T. Droniou, P. Lebourg, P. Armagnat; Running Scan Test on Three Pins: Yes We Can!; IEEE; 2009; International Test Conference; Paper 18.1; pp. 1-10.
A. Chandra, R. Kapur, Y. Kanzawa; Scalable Adaptive Scan (SAS); 2009; EDAA.

* cited by examiner

*Primary Examiner* — Sun Lin
(74) *Attorney, Agent, or Firm* — Dickstein Shapiro LLP

(57) ABSTRACT

A method and apparatus to apply compressed test patterns using a very pin-limited test apparatus to a chip design for use in semiconductor manufacturing test is disclosed. Compression circuitry is inserted into the circuit design and the compressed signals manipulated for communication over a serial interface. On a test apparatus, ATPG may be run, assuming a parallel test interface, resulting in test patterns that may be compressed into a parallel format and then converted into a serial signal. On chip, the serial signal is parallelized, decompressed, and then shifted into the scan chains. An inserted controller generates clocks and various control signals. Conventional test patterns from ATPG may be generated and applied during testing without the need to modify the ATPG program saving time and resources. Hierarchical testing of integrated circuits built with a multiplicity of cores, each having its own embedded compression logic, is also supported.

24 Claims, 18 Drawing Sheets

METHOD AND APPARATUS FOR LOW-PIN COUNT TESTING OF INTEGRATED CIRCUITS

FIELD

The present patent document relates generally to testing of integrated circuits having very limited pins accessible for test use during manufacturing test. In particular, the present patent document relates to a method and apparatus for compressing and decompressing test patterns for application to an integrated circuit.

BACKGROUND

With increasingly smaller geometries and feature sizes of integrated circuit devices (chips), an ever-increasing amount of logic can be placed on a single chip. Semiconductor manufacturers are under increasing pressure to reduce the number of defective products shipped while producing large volumes at low costs. Semiconductor manufacturing tests can be expensive and time consuming. One method to decrease the cost of test while being able to ship large product volumes is to test multiple chips in parallel using multi-site test. Another method is to apply efficient and high-quality tests using a low cost tester that use very limited set of pins. In addition to wafer and module testing described above some other applications that will benefit from reliable and efficient low cost testing include burn-in test and system or board-test.

Chip customers in some design spaces would like to reduce the number of test pins down to three or fewer pins, for example in automotive applications or for analog chips have a small amount of digital logic. In these spaces, test pin access is very limited. These chip customers would like to have one input pin for test data, one output pin for test data, and one test clock.

However, such a low number of pins can negatively impact the quality of the results obtained from testing. Reduced pin counts require test data compression, whereby the test data is compressed from a larger number of pins down to a small number of pins. Even for a small number of pins, complete test generation programs are generally required. Such test generation programs generally include high test coverage, low tester volumes, memory self-test, logic self-test, on-product clock generation, and other mechanisms to verify that the design was manufactured correctly. Presently, to accomplish these requirements, more than three pins are required.

Furthermore, the power consumed during the run of the test application must fit within the power budget for the chip. Modern chips, such as a typical system-on-a-chip device, may have millions of flops, such that the power consumption from toggle activity from scan shifting during test may easily exceed the limits allowed by the power budget. Where a low-number of pins are used, present low-pin test methods do not allow for multiple controlled scan clocks that may be staggered to reduce instantaneous switching activity, and thus power consumption.

In light of the above, there is a need for a low-pin scanning architecture that enables a full test suite, provides good quality of results, and addresses scan power issues in a low-pin environment.

SUMMARY

A method and apparatus for low-pin count testing of integrated circuits is disclosed.

According to an embodiment a computer-implemented method of generating scan test circuitry for insertion into an integrated circuit design is described. The steps of the method include: receiving an integrated circuit design for storage in memory; instantiating in the integrated circuit design one or more deserializers, one or more decompressors, a plurality of cores comprising a plurality of scan chain registers, and a controller, wherein each deserializer is configured to receive a serial input signal comprising a parallel output from an automatic test-pattern generator that has been compressed and manipulated into a serial bitstream, and wherein each deserializer is configured to output a parallel compressed signal, and wherein the corresponding decompressor is configured to receive the parallel compressed signal and outputs a plurality of test patterns; and configuring the controller so that it will transmit a plurality of scan clocks to the plurality of scan chain registers during scan testing to shift the plurality of scan chain registers.

In another embodiment, the deserializer is further configured to output a mask bit signal, and the steps of the method further include instantiating in the integrated circuit design a mask register to receive the mask bit signal and to mask an output from the plurality of scan chain registers.

In another embodiment, the plurality of scan clocks are interleaved to sequentially shift the plurality of scan chain registers.

In another embodiment, the plurality of scan chain registers of a core of the plurality of cores are shifted independently in time from the plurality of scan chain registers of each other core of the plurality of cores.

In another embodiment, the controller comprises a state machine.

In another embodiment, the state machine comprises a JTAG interface state machine.

In another embodiment, the serial input signal further comprises state machine control bits.

In another embodiment, the controller is configured to enable on-product clock generation.

In another embodiment, the controller is programmable during operation.

In another embodiment, the decompressor comprises a plurality of stages arranged in a hierarchy.

In another embodiment, the plurality of scan clocks are interleaved to sequentially shift the plurality of scan chain registers.

According to an embodiment, a computer-readable non-transitory storage medium having stored thereon a plurality of instructions is disclosed. The plurality of instructions when executed by a computer, cause the computer to perform: receiving an integrated circuit design for storage in memory; instantiating in the integrated circuit design one or more deserializers, one or more decompressors, a plurality of cores comprising a plurality of scan chain registers, and a controller, wherein each deserializer is configured to receive a serial input signal comprising a parallel output from an automatic test-pattern generator that has been compressed and manipulated into a serial bitstream, and wherein each deserializer is configured to output a parallel compressed signal, and wherein the decompressor is configured to receive the parallel compressed signal and outputs a plurality of test patterns; and configuring the controller so that it will transmit a plurality of scan clocks to the plurality of scan chain registers during scan testing to shift the plurality of scan chain registers.

In another embodiment, the deserializer is further configured to output a mask bit signal, and the plurality of instructions when executed by a computer, cause the computer to further perform instantiating in the integrated circuit design a mask register to receive the mask bit signal and to mask an output from the plurality of scan chain registers.

In another embodiment, the plurality of scan clocks are interleaved to sequentially shift the plurality of scan chain registers.

In another embodiment, the plurality of scan chain registers of a core of the plurality of cores are shifted independently in time from the plurality of scan chain registers of each other core of the plurality of cores.

In another embodiment, the controller comprises a state machine.

In another embodiment, the state machine comprises a JTAG interface state machine.

In another embodiment, the serial input signal further comprises state machine control bits.

In another embodiment, the controller is configured to enable on-product clock generation.

In another embodiment, the controller is programmable during operation.

In another embodiment, the decompressor comprises a plurality of stages arranged in a hierarchy.

In another embodiment, the plurality of scan clocks are interleaved to sequentially shift the plurality of scan chain registers.

In another embodiment, an apparatus for scan testing an integrated circuit is disclosed. The apparatus comprises one or more deserializers, each having an input, wherein each deserializer is configured to receive at the input a serial input signal comprising a parallel output of an automatic test-pattern generator that has been compressed and manipulated into a serial bitstream, and wherein each deserializer outputs a parallel compressed signal at an output; a decompressor electrically connected to the deserializer, wherein the decompressor is configured to receive the parallel compressed signal and outputs a plurality of test patterns; a plurality of scan chain registers electrically connected to the decompressor and grouped in a plurality of cores; and a controller programmed to transmit a plurality of scan clocks to the plurality of cores, wherein the plurality of scan clocks shift the plurality of scan chain registers.

In another embodiment, the apparatus further comprises a mask register to mask an output from the plurality of scan chain registers, wherein the mask register configured to receive a mask bit signal output from the deserializer.

In another embodiment, the plurality of scan clocks are interleaved to sequentially shift the plurality of scan chain registers.

In another embodiment, each group of scan chain registers is shifted independently in time from each other group of scan chain registers.

In another embodiment, the controller comprises a state machine.

In another embodiment, the state machine comprises a JTAG interface state machine.

In another embodiment, the serial input signal further comprises state machine control bits.

In another embodiment, the controller is configured to enable on-product clock generation.

In another embodiment, the controller is programmable during operation.

In another embodiment, the decompressor comprises a plurality of decompression stages arranged in a hierarchy.

In another embodiment, the plurality of scan clocks are interleaved to sequentially shift the plurality of scan chain registers.

According to an embodiment, a computer-implemented method of generating scan test circuitry for insertion into an integrated circuit design is disclosed. The method comprised: receiving an integrated circuit design for storage in memory; instantiating in the integrated circuit design an input pin, a clock pin, an output pin, a plurality of cores comprising a plurality of scan chains having scan chain registers, and a state machine controller adapted for three external test pins and electrically connected to the plurality of scan chain registers, the input pin, the clock pin, and the output pin; configuring the state machine controller to direct scan data to be received from the input pin to the plurality of scan chains; and configuring the state machine controller to generate a plurality of scan clocks to pulse the plurality of scan chain registers during scan testing to shift the plurality of scan chain registers.

In another embodiment, the method further comprises instantiating in the integrated circuit design a mask register to receive a mask bit signal and to mask an output from the plurality of scan chains; and configuring the state machine controller to output the mask bit signal.

In another embodiment, the plurality of scan clocks will be interleaved to sequentially shift the scan chain registers of the plurality of cores.

In another embodiment, the plurality of scan chain registers of a core of the plurality of cores will be shifted independently in time from the plurality of scan chain registers of each other core of the plurality of cores.

In another embodiment, the state machine controller is configured to provide states to enable on-product clock generation.

In another embodiment, the plurality of cores are arranged in a hierarchy.

In another embodiment, the state machine is configured to reset after receiving a number of pulses greater than the number of scan chain registers.

In another embodiment, the state machine controller is programmable during operation.

According to an embodiment, a computer-readable non-transitory storage medium having stored thereon a plurality of instructions is disclosed. The plurality of instructions when executed by a computer, cause the computer to perform: receiving an integrated circuit design for storage in memory; instantiating in the integrated circuit design an input pin, a clock pin, an output pin, a plurality of cores comprising a plurality of scan chains having scan chain registers, and a state machine controller adapted for three external test pins and electrically connected to the plurality of scan chain registers, the input pin, the clock pin, and the output pin; configuring the state machine controller to direct scan data to be received from the input pin to the plurality of scan chains; and configuring the state machine controller to generate a plurality of scan clocks to pulse the plurality of scan chain registers during scan testing to shift the plurality of scan chain registers.

In another embodiment, the plurality of instructions when executed by a computer, cause the computer to further perform instantiating in the integrated circuit design a mask register to receive a mask bit signal and to mask an output from the plurality of scan chains; and configuring the state machine controller to output the mask bit signal.

In another embodiment, the plurality of scan clocks will be interleaved to sequentially shift the scan chain registers of the plurality of cores.

In another embodiment, the plurality of scan chain registers of a core of the plurality of cores will be shifted independently in time from the plurality of scan chain registers of each other core of the plurality of cores.

In another embodiment, the state machine controller is configured to provide states to enable on-product clock generation.

In another embodiment, the plurality of cores are arranged in a hierarchy.

In another embodiment, the state machine is configured to reset after receiving a number of pulses greater than the number of scan chain registers.

In another embodiment, the state machine controller is programmable during operation.

According to an embodiment, an apparatus for scan testing an integrated circuit is disclosed. The apparatus comprises: external test pins including an input pin, a clock pin, and an output pin; a plurality of cores comprising a plurality of scan chains having scan chain registers; and a state machine controller adapted for the external test pins and electrically connected to the plurality of scan chain registers, the input pin, the clock pin, and the output pin, wherein the state machine controller is configured to direct scan data to be received from the input pin to the plurality of scan chains, and wherein the state machine controller is configured to generate a plurality of scan clocks to pulse the plurality of scan chain registers during scan testing to shift the plurality of scan chain registers.

In another embodiment, the apparatus further comprises a mask register to receive a mask bit signal and to mask an output from the plurality of scan chains, and the state machine controller is configured to output the mask bit signal.

In another embodiment, the plurality of scan clocks are interleaved to sequentially shift the scan chain registers of the plurality of cores.

In another embodiment, the plurality of scan chain registers of a core of the plurality of cores are shifted independently in time from the plurality of scan chain registers of each other core of the plurality of cores.

In another embodiment, the state machine controller provides states to enable on-product clock generation.

In another embodiment, the plurality of cores are arranged in a hierarchy.

In another embodiment, the state machine is configured to reset after receiving a number of pulses greater than the number of scan chain registers.

In another embodiment, the state machine controller is programmable during operation.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
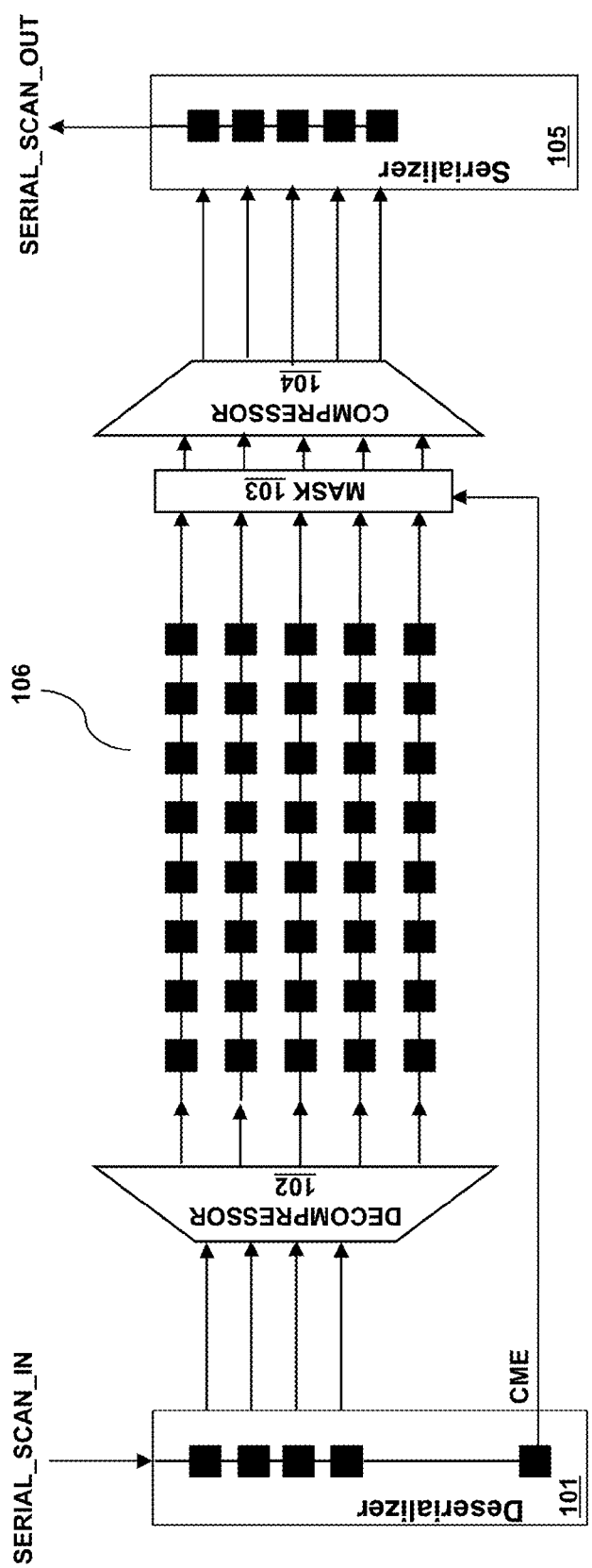
FIG. 1 is a high level illustration of a time domain compression/decompression (TDCD) architecture.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for compressing and decompressing test patterns for application to an integrated circuit design is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 is a high level illustration of a time domain compression/decompression (TDCD) architecture according to an embodiment. During automatic test pattern generation (ATPG), test patterns are generated off-chip. The parallel test patterns are then serialized off-chip using circuitry to generate serial digital signal SERIAL_SCAN_IN. In this embodiment SERIAL_SCAN_IN is a five-bit digital, but this number is arbitrary; the number of bits could be more or less than five. SERIAL_SCAN_IN is transmitted on-chip to deserializer 101. The five-bit digital signal SERIAL_SCAN_IN here contains four bits of data, which are sent to decompressor 102 in parallel by deserializer 101, and a channel mask enable bit CME, which is sent to mask 103 by deserializer 101. For an eight-bit digital signal, there would be seven bits of data in addition to the channel mask enable bit. Decompressor 102 consists of logic that decompresses the four data bits into internal scan chains 106. Here there are five scan chains shown, although a fewer or a greater number of scan chains may be generated. The internal scan chains are some fixed length of M-bits, here 8 bits. Internal scan chains 106 are scanned through the core, and received at mask 103. Mask 103 masks unknown states, also known as "X" states. Sources of X states include un-modeled logic, such as RAM or mixed-signal logic, corrupted non-scan bits, bits on paths slower than the tester launch-capture cycle, and unintended consequences of last minute design changes. Although not illustrated, the mask registers of mask 103 are loaded with the four bits from deserializer 101. Mask 103 passes the scan chains to compressor 104 as a five-bit parallel signal. Compressor 104 converts the parallel signal to a five-bit signal that is passed to serializer 105 and output serially as SERIAL_SCAN_OUT. Signal SERIAL_SCAN_OUT is transmitted from on-chip to off-chip over a pin, where it is received by the ATE.

In the described embodiments, a channel mask enable bit CME in the input digital signal SERIAL_SCAN_IN and mask 103 are described, assuming that a design uses X-masking. If the design does not use X-masking, then the CME bit and mask 103 may be omitted.

The logic for the TDCD architecture is inserted as with other design for test (DFT) logic. Such logic includes deserializer 101 and serializer 105, each of which includes sets of registers for temporarily storing the input serial data from off-chip and the parallel data from compressor 104, respectively. Other logic includes a clock controller. An on-chip state machine ensures that the internal scan chains 106 receive a clock only when the parallel data is ready, that is, where there are five deserializer bits, every fifth cycle. Furthermore, the TDCD logic is marked as inactive in the ATPG testmode, meaning that it is transparent to the ATPG circuitry.

The flow for generating test patterns according to this embodiment involves the creation of dummy parallel interface in a test generation program. The initial netlist from a design synthesis program will contain only serial interface scan pins. Within the test generation program, a dummy parallel interface is created. Test pattern generation is then performed using this dummy parallel interface. These patterns are then manipulated into a serial interface. For simulation, both the patterns generated for the parallel interface and the patterns generated for the serial interface are translated.

The use of a parallel interface results in several advantages. One advantage is that a lower ATPG pattern count is achievable where either a real or dummy parallel interface is used, because the correlation is reduced as compared to using a few serial pins to drive the decompressor directly. Another advantage is that there is no additional complexity in failure diagnosis of the serial interface patterns. Changes to the diagnostic tools are not needed and they can continue to support only the parallel interface patterns. Failures with the serial patterns can be simply translated back to their corresponding position in the parallel interface patterns before being handed off to the diagnostics engine. To the diagnostic tool, it appears to be diagnosing parallel interface patterns. Also, because the test patterns are manipulated post-ATPG, the parallel interface can be used to pipeclean and improve the ATPG quality of results without having to include the pattern conversion during each ATPG invocation. This reduces the turnaround time when resolving ATPG issues since the test generator does not have to worry about the pattern conversion mechanism.

Figure 2:
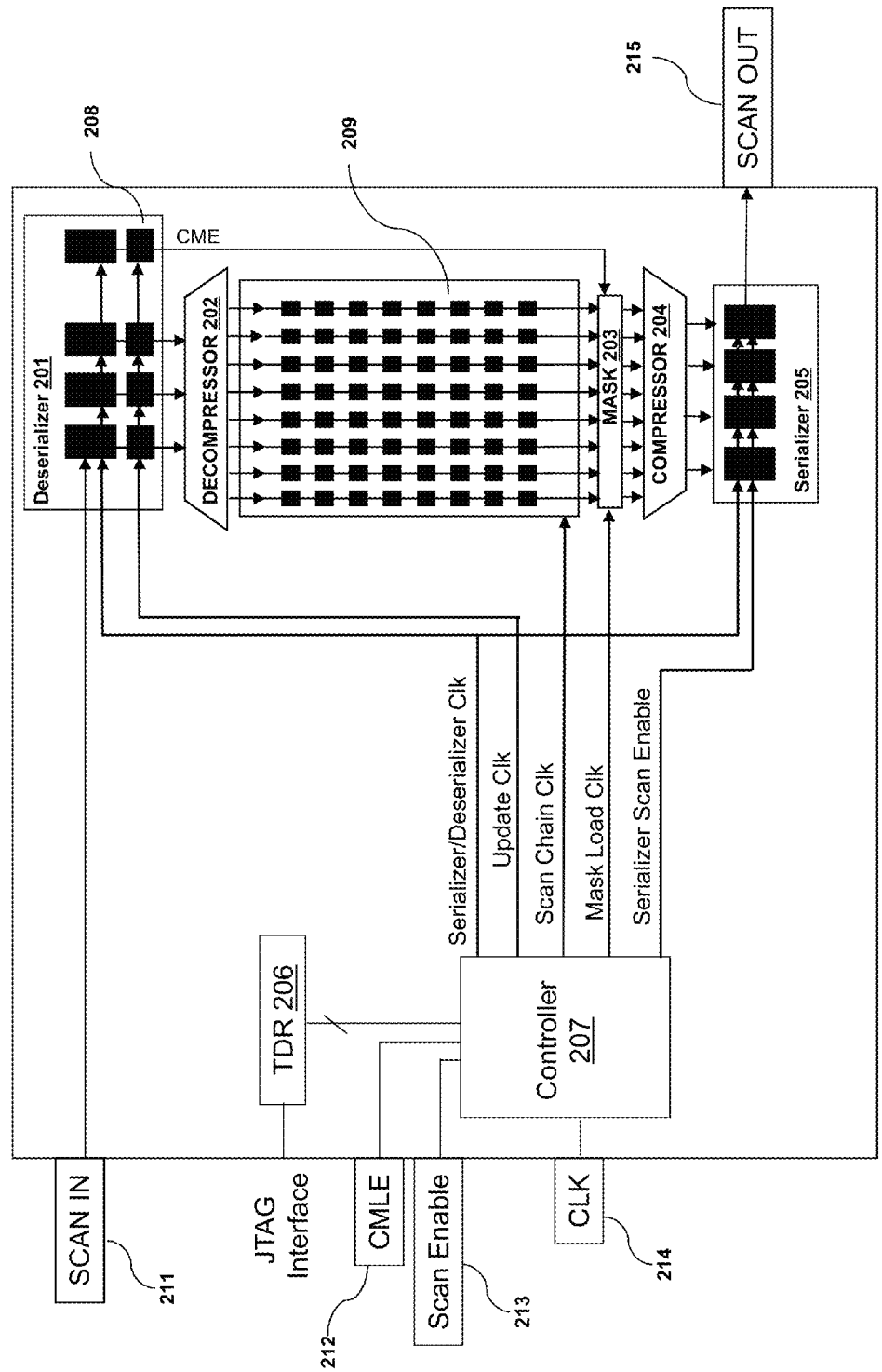
FIG. 2 illustrates a five-pin TDCD test architecture.

FIG. 2 illustrates a five-pin TDCD architecture according to an embodiment. The SCAN IN pin 211 at the chip interface receives serialized test patterns generated by the test generation program and serialized into a four-bit signal, having three bits of data and one bit for the mask signal CME. As similarly described in connection with FIG. 1, the serialized signal is shifted into deserializer 201, where it is passed to decompressor 202 as a parallel signal via update stage 208 of deserializer 201, where it is converted into eight scan chains 209, each 8 bits in length. Of course there may be greater or fewer numbers of scan chains, each having a greater or fewer number of bits. Likewise, the scan chains need not be of uniform length. The mask bit CME is passed to mask 203, masking out X states prior to compression by compressor 204. The compressed parallel signals, here four bits wide, are passed to serializer 205, which serializes the signal and outputs it at SCAN OUT pin 215. As previously noted, the CME mask bit and mask 203 may optionally be omitted.

In addition to the deserializer 201, decompressor 202, mask 203, compressor 204, and serializer 205, controller 207 is inserted in the circuit design by the design synthesis and test generation program to control blocks 201-205. In this five-pin interface architecture, controller 207 receives three signals over three pins: a mask load enable signal at CMLE pin 212; a scan enable signal at Scan Enable pin 213; and a clock signal at CLK pin 214. The embodiments disclosed herein are also compatible with multiple top-level clocks, and are not restricted to systems having a single top-level clock received at CLK pin 214. Controller 207 also receives data from a set of standard parallel test data registers TDR 206 for connection to an interface. Here, the interface is a standard Joint Test Action Group (JTAG) interface, which could be for example an IEEE 1149.1 JTAG interface or an IEEE 1149.7 cJTAG interface. However, a variety of proprietary interfaces can be supported instead of, or in addition to, a JTAG interface. From these inputs, controller 207 generates a variety of signals, including clocks. To allow for design flexibility or engineering change orders, controller 207 is programmable. For example, controller 207 may be programmed to tolerate bits in the deserializer or serializer that may be unused and do not connect to either decompressor 202 or compressor 204. The Serializer/Deserializer Clk signal clocks the registers of the deserializer 201 and serializer 205. The Update Clk signal is used by update stage 208 to trigger the update of the parallel signal entering decompressor 202 and the mask bit signal CME received by mask 203. The update stage 208 is an optional stage that allows for skew-safe loading of the scan chains 209 and prevents unnecessary switching within decompressor 202 while deserializer 201 is shifting data. The Scan Chain Clk signal clocks scan chains 209. The Mask Load Clk signal controls the loading of mask 203. The Serializer Scan Enable signal enables the output of response data from serializer 205.

Figure 3:
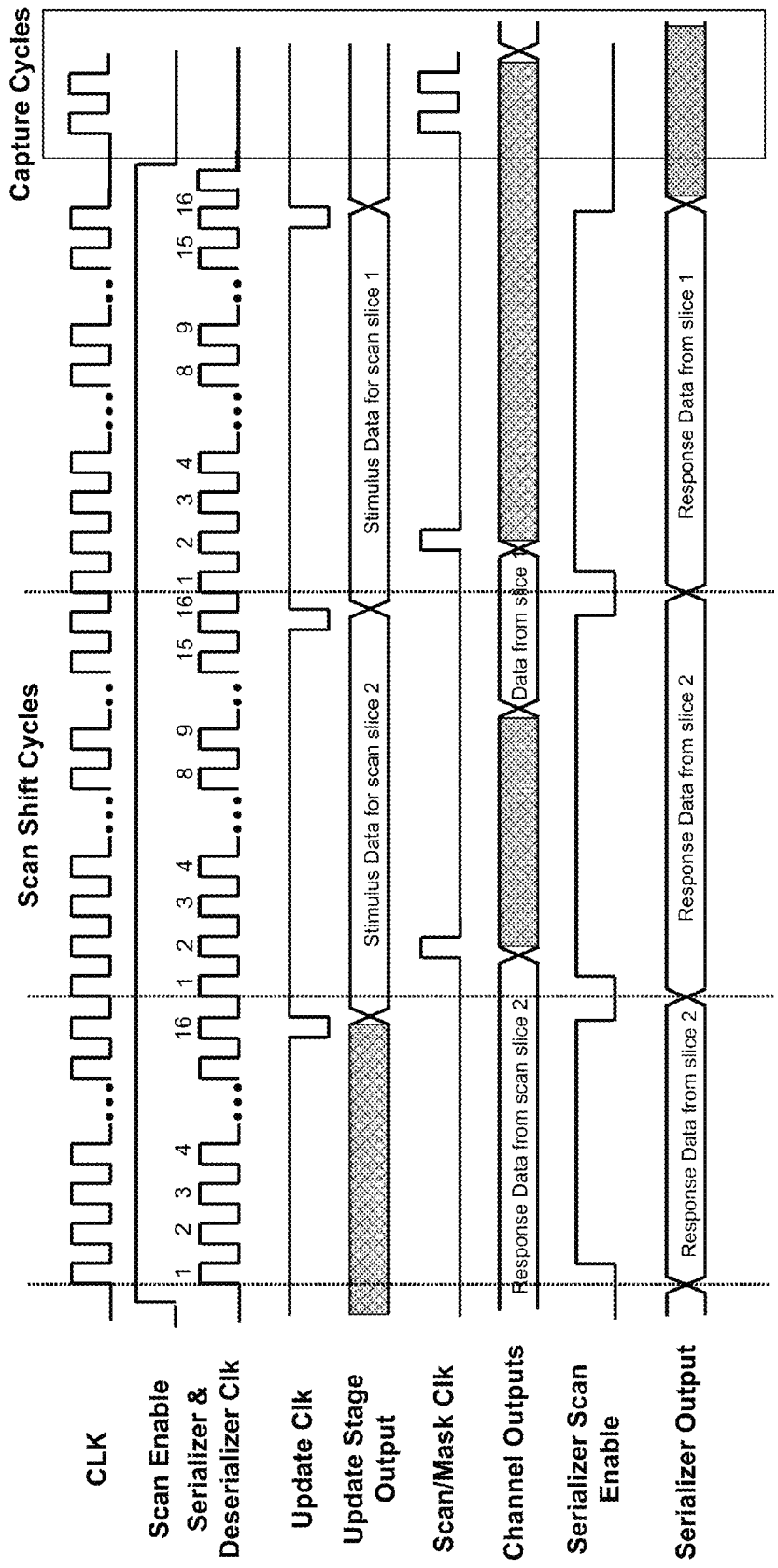
FIG. 3 illustrates the waveforms of selected signals of five-pin interface TDCD architecture.

FIG. 3 is a timing diagram illustrating the waveforms of selected signals of the five-pin interface architecture illustrated in FIG. 2, where the deserializer 201 is instead sixteen bits wide, and the scan chains are 2 bits long.

Figure 7:
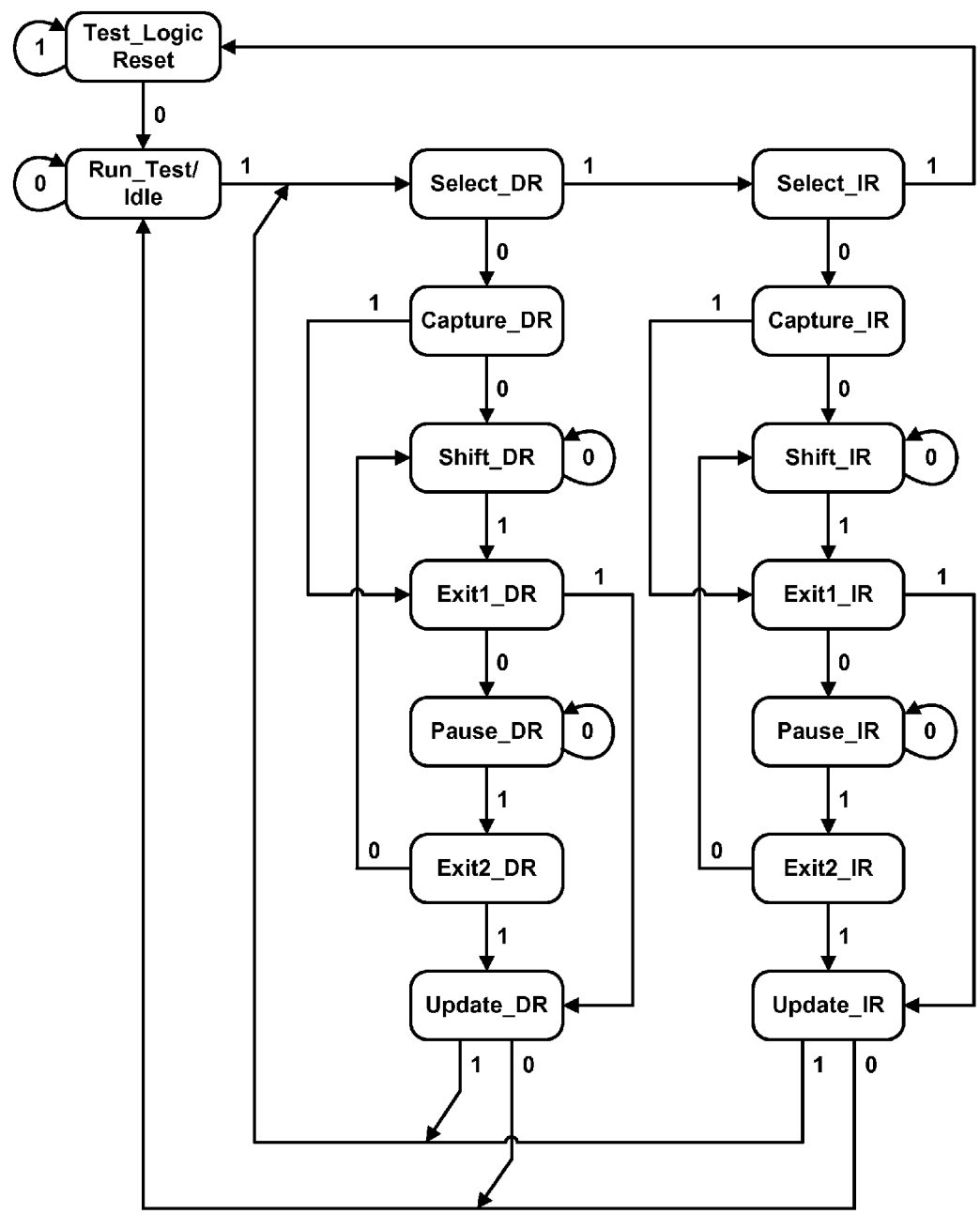
FIG. 7 illustrates a state machine for JTAG (IEEE 1149.1).

FIG. 7 is a state machine for JTAG, mapping IEEE 1149.1 TAP ports to the TDCD pins. Table 1 describes the relationship between the JTAG state machine of FIG. 7, including TAP ports, and the TDCD pins, including internal pins and signals. This relationship allows the serial interface to be overlapped with a IEEE 1149.1 JTAG interface, or with a IEEE 1149.7 (cJTAG) interface, by decoding the internal state machine defined by these standards and using the state machine to trigger operations within the TDCD architecture.

TABLE 1

| TDCD Pins | TAP Port/ Internal signal | JTAG State/ Event Trigger |
|---|---|---|
| Scan In | TDI | |
| Scan Out | TDO | |
| CLK | TCK | |
| TDCD Enable | Instruction Decode | |
| Parallel Access | Instruction Decode | |
| Scan Shift Enable (SE) | Shift_DR State | Transition from Capture_DR to Shift_DR |
| Mask Load Enable (CMLE) | Shift_DR State | Transition from Exit2_DR to Shift_DR |
| Capture Enable | Pause_DR State | First Pause_DR to Pause_DR Transition |
| Mask Enable (CME) | Internally extracted from data coming from SI port | |

In an alternative embodiment, both serial and parallel interfaces are available on a package. Whereas in the above-described embodiment, only serial interfaces are available on a package, and the serial interface is used during manufacturing test, here both parallel and serial interfaces are available on a package. The parallel interface is the conventional approach, for example an interface having eight inputs and eight outputs. The serial interface is, for example, a single input and a single output. The parallel interface can be used for manufacturing test and the serial interface can be used for system test.

Figure 4:
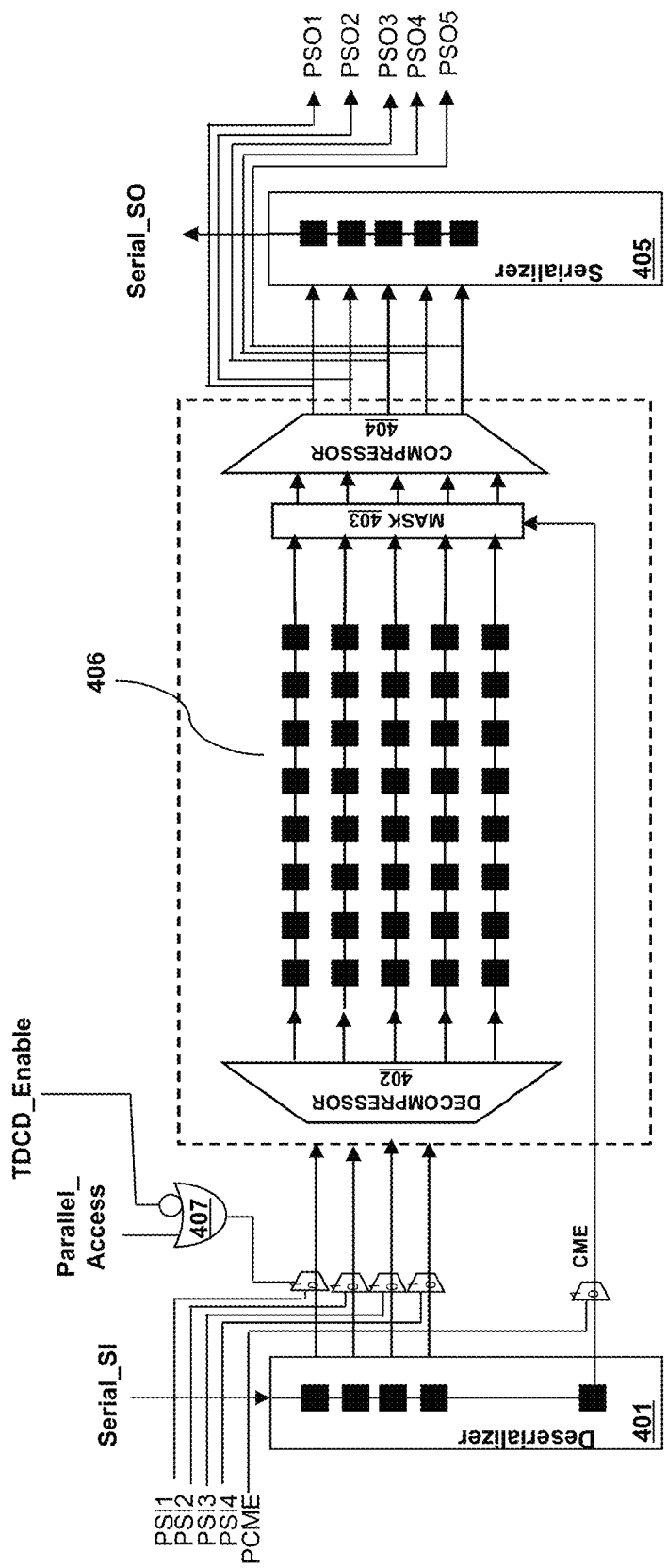
FIG. 4 is a high level illustration of a TDCD architecture having both serial and parallel interfaces.

FIG. 4 illustrates a high level illustration of a TDCD architecture having both serial and parallel interfaces. According to an embodiment, four signals PSI1, PSI2, PSI3, and PSI4 are received at pins of the chip and passed via four signal lines to the input of two-input multiplexers. These four signals carry test patterns generated as part of a conventional approach to ATPG. Here, there are four signal lines, but a different number of signal lines may be used. A fifth signal line PCME carries the channel mask enable signal for the parallel interface, and is received at a fifth two-input mux. A serial signal Serial_SI is likewise received at the chip on a single pin, and routed to deserializer 401. Here, the serial signal is a five-bit signal having four bits of test pattern data and a fifth bit carrying the mask bit CME. Deserializer 401 passes the four bits of the signal to a second input of the two-input muxes, and CME to the fifth mux. For both the serial and parallel interfaces, the number of bits of test pattern data, here four, in the serial interface should align with the number of parallel signal lines, but the number may be greater or fewer than four, and the circuitry scaled up or down in size accordingly. The selection of the inputs of the two-input muxes is determined by a control signal which is the output of an or gate having an inverted input 407, which has two inputs, Parallel_Access and TDCD_Enable. TDCD_Enable is in an active high state when in the TDCD testmodes. An inactive value causes the serial bits from deserializer 401 to be passed to decompressor 402 and the serial bits included in the scan chains 406. When the Parallel_Access signal is in an active high state, the parallel interface is selected and the parallel interface signals PSI1, PSI2, PSI3, PSI4, and PCME are passed to decompressor 402. The Parallel_Access signal in an inactive state selects for the serial interface.

Internal scan chains 406 are scanned through the core, and received at mask 403. Mask 403 receives the mask signal CME, which is either a PCME from the parallel interface or from the serial interface. Although not illustrated, the mask registers of mask 403 are loaded with the four bits from deserializer 401 when the serial interface is selected, and the four parallel interface signals PSI1, PSI2, PSI3, and PSI4 when the parallel interface is selected. Mask 403 passes the masked scan chains to compressor 404 as a five-bit parallel signal. Compressor 404 converts the parallel signal to a five-bit signal that is passed to both serializer 405 and the output parallel interface on pins PSO1, PSO2, PSO3, PSO4, and PSO5. Serializer 405 serializes the five-bit signal and outputs it at a serial output signal Serial_SO destined for the chip's serial output pin.

This architecture may be used, for example, where the serial interface is used for system test, and an additional parallel scan interface is used for manufacturing test. Of course, where only serial interfaces are present, only serial interfaces may be used for both system and manufacturing test. The selection of interfaces is available during the process of inserting test circuitry. FIG. 4 would be similar where only a serial interface is present, except that the parallel interface, including inputs PS1, PS2, PS3, PS4, and PCME would be dummy pins, rather than real pins, as discussed above for the dummy parallel interface having dummy pins.

The flow for generating test patterns according to this embodiment involves both the parallel interface and serial interface for the test generation program. The initial netlist from a design synthesis program will contain both the serial interface and parallel interface scan pins. The parallel interface patterns are manipulated to apply to the serial interface. Thus, the patterns can be applied using either interface. For simulation, both the patterns generated for the parallel interface and the patterns generated for the serial interface are translated.

Figure 5:
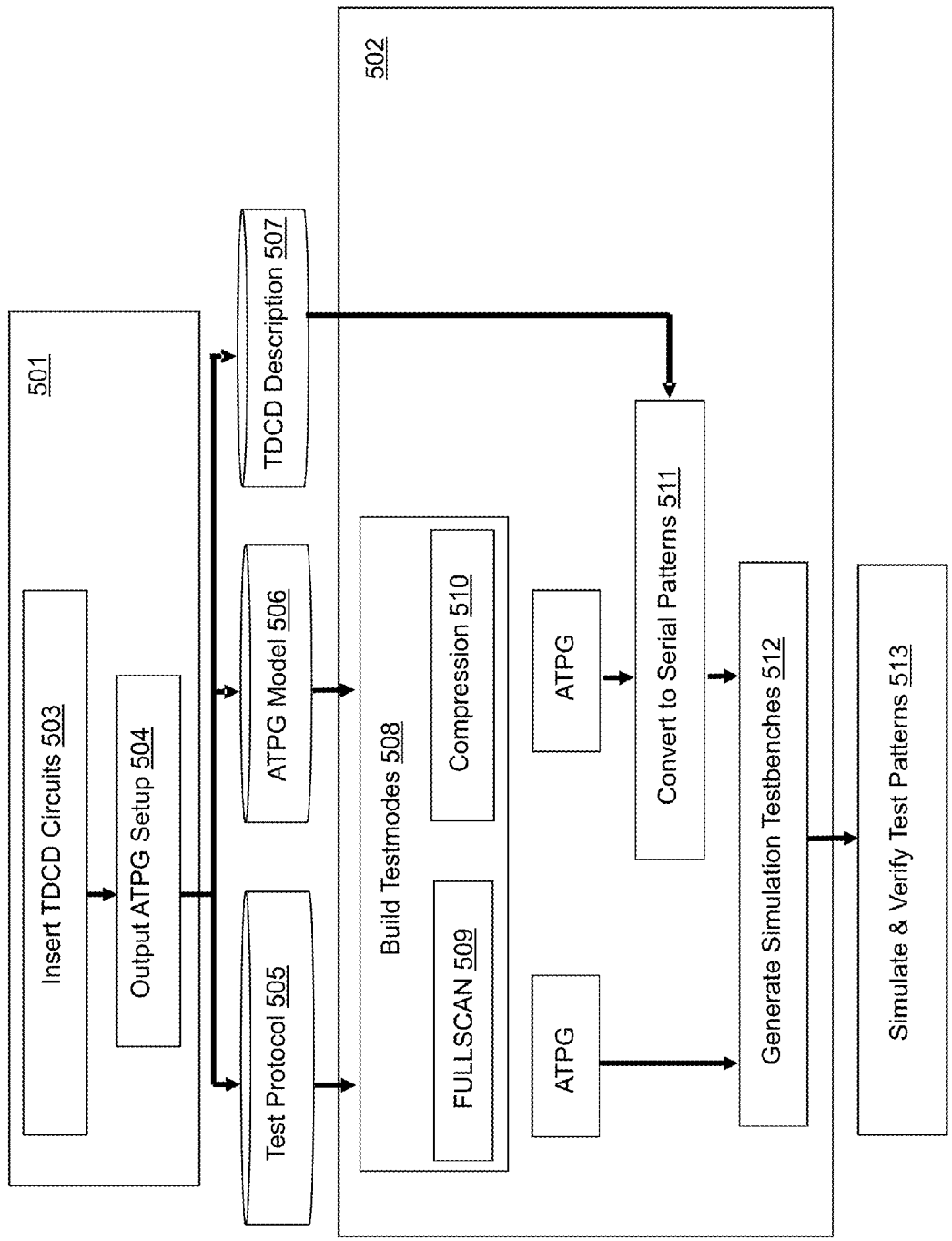
FIG. 5 illustrates an exemplary flow from synthesis of TDCD circuitry through the simulation and verification of both parallel and serial test patterns.

FIG. 5 illustrates a flow from synthesis of TDCD circuitry through the simulation and verification of both parallel and serial test patterns according to an embodiment. Block 501 represents the steps for generation of design synthesis in the design synthesis and test generation program. First TDCD circuitry is inserted into the circuit design at step 503. At step 504, the ATPG setup is output, including test protocol 505, ATPG model 506, and TDCD description 507. Test protocol 505 and ATPG model 506 are used in block 502, part of the test generation program, to build testmodes at step 508. Both a fullscan testmode 509 and a compression testmode 510 are generated. For the fullscan testmode, the test patterns generated during the process of ATPG are directly used to generate a simulation testbench at step 512 for the parallel patterns. For the compression testmode 510, the test patterns are converted from parallel, as the standard output from ATPG, into serial patterns at step 511. These serial patterns are then used to generate a further simulation testbench at step 512 for the serial patterns. The resultant test patterns are then simulated and verified at step 513.

Figure 6:
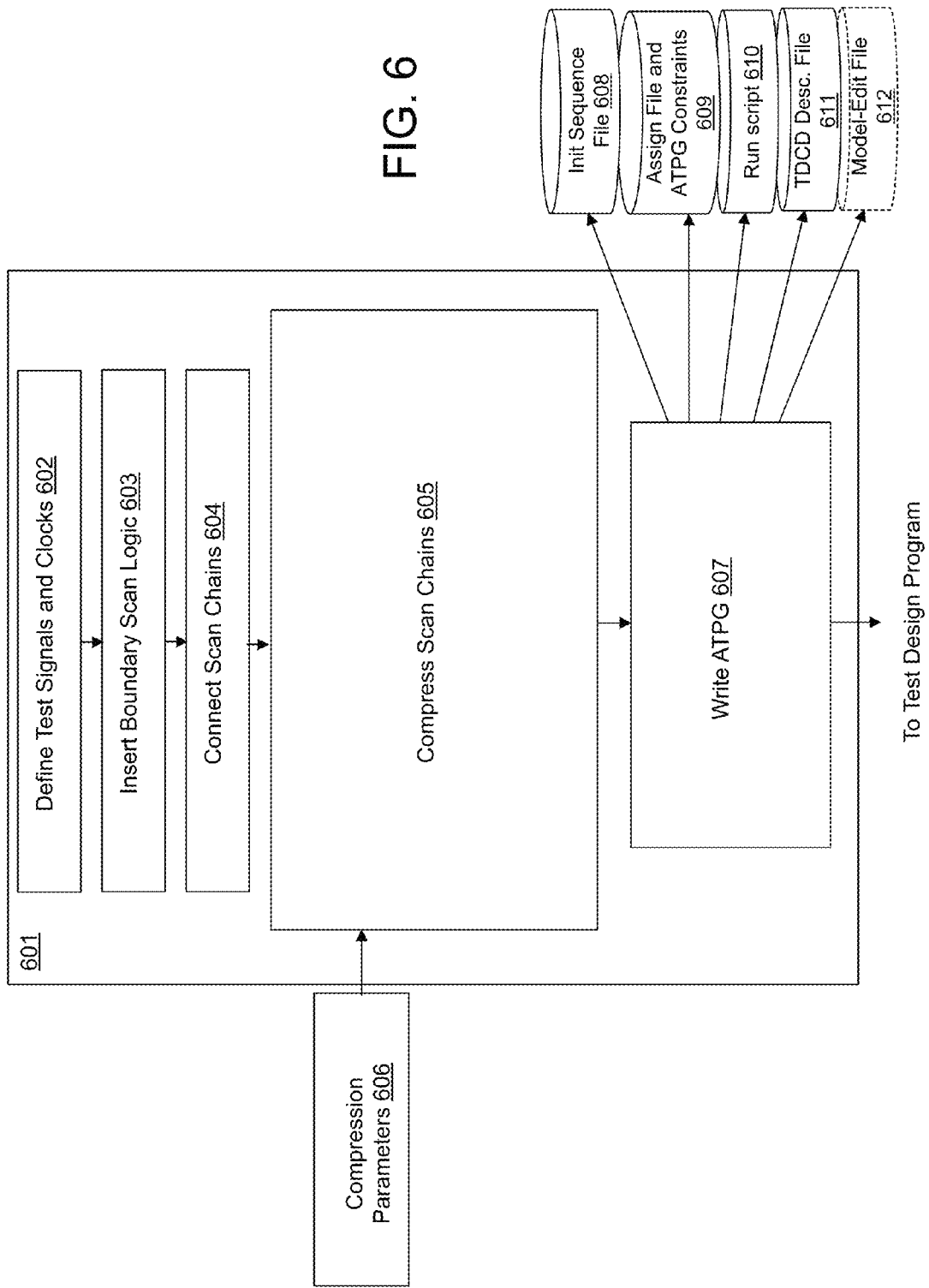
FIG. 6 illustrates an exemplary flow of a synthesis portion of a flow from synthesis of TDCD circuitry through the simulation and verification of both parallel and serial test patterns.

FIG. 6 illustrates further detail for the synthesis portion of the flow of FIG. 5, and the resultant inputs to the test generation program. Block 601 includes steps performed as part of design synthesis. First, at step 602, the test signals and clocks are defined in the program. At step 603, optional boundary scan logic is inserted into the target circuit design, and the scan chains connected up at step 604. The user provides compression parameters 606. These parameters describe the requirement for the insertion of TDCD compression circuitry in step 605. These scan chains are compressed at step 605. During this step a compression macro is generated and inserted into the testing program to compress the test patterns generated by the ATPG, and manipulate the test patterns to be compatible with a serial interface of the TDCD architecture. The compression macro can support test patterns with and without X-masking, and can support XOR compression, both with and without using an input spreader. The compression can be asymmetric. Bits for TDCD are added to the full scan chains, and the mask registers prepended to the scan chains. Compression muxes are inserted in the circuit design, as well as the muxes used to mux different scan configurations, for example the parallel scan interface or the serial scan interface into the scan chain. In addition, the test data registers are created anew, if a user TDR is present in the circuit design, then it is connected up to the TDCD compression circuitry. Once the scan chains are compressed, files are written reflecting the ATPG setup at step 607. These files include the initiation sequence file 608 to load the compression TDR, assign file and ATPG constraints 609 that ensures that the generated test patterns are correctly serializable, ATPG run script 610 for all test modes, description file 611 that is specific to TDCD architecture, and model-edit file 612. These files may then be used further by the test generation program as further described above as part of block 502.

The information generated in the flow may be verified by the test generation program, either before or after the ATPG test patterns are manipulated. Verification ensures that register bits and serial pins are present in the resulting model. Verification also confirms connectivity between the registers of the serial input pin and the deserializer registers, as well as between the serial output pin and the serializer registers.

The constraint files 608-612 may be used to ensure that test patterns are correctly serialized prior to application to the serial input pin. Application of the constraints may result in certain faults being untestable in testmodes where the TDCD architecture is applied. These faults may be tested in testmodes not using the TDCD architecture. The description file 611 defines the serial scan in and serial scan out pins and correlates bits of the serializer and deserializer registers to the pins of the parallel interface. Model-edit file 612 is generated when only a serial interface is present in the netlist. This file is used by the test generation program to create a dummy parallel interface having dummy pins.

Table 2 is a summary of testmodes generated by the test generation software when both a serial and a parallel interface are available. In the example of Table 2, the internal scan/compression configuration is for one hundred twenty compression channels, eight fullscan chains, and twenty-four thousand flops, and the scan pins for each interface have one serial scan in (SSI) pin, one serial scan out (SSO) pin, seven serial input (SI) pins, eight serial output (SO) pins, and one mask enable pin (CME).

TABLE 2

| Testmodes | Scan Interfaces inserted by DFT | Scan pins used for each interface | Internal Scan/Compression configuration | Comments |
|---|---|---|---|---|
| COMPRESSION_DECOMP_TDCD & COMPRESSION_TDCD | Parallel Interface<br>Serial Interface | 7 SI, 8 SO, 1 CME<br>1 SSI, 1 SSO | Decompressor has 7 inputs, Compressor has 8 outputs. There are 120 channels each 200 bits long. | There will be some ATPG constraints applied in these modes |
| COMPRESSION_DECOMP & COMPRESSION | Parallel Interface<br>— | 7 SI, 8 SO, 1 CME<br>— | Decompressor has 7 inputs, Compressor has 8 outputs. There are 120 channels each about 200 bits long. Some channels are longer due to TDCD flops. | These modes will:<br>1. Target faults not testable in TDCD modes due to ATPG constraints.<br>2. Test faults in TDCD logic.<br>3. Can be used as top-off in case FULLSCAN is not used. |
| FULLSCAN | Parallel Interface<br>— | 8 SI, 8 SO<br>— | 8 Fullscan chains each about 3000 bits long. Some chains are longer due to TDCD flops. | |

Table 3 is a summary of testmodes generated by the test generation software when only a serial interface is available. In the example of Table 3, the internal scan/compression configuration is for one hundred twenty compression channels, one fullscan chain, and twenty-four thousand flops, and the scan pins for each interface have one serial scan in (SSI) pin, one serial scan out (SSO) pin, one serial input (SI) pins, and one serial output (SO) pins.

TABLE 3

| Testmodes | Scan Interfaces inserted by DFT | Scan pins used for each interface | Internal Scan/Compression configuration | Comments |
|---|---|---|---|---|
| COMPRESSION_DECOMP TDCD & COMPRESSION_TDCD | —<br>Serial Interface | —<br>1 SSI, 1 SSO | Decompressor has 7 inputs, Compressor has 8 outputs. There are 120 channels each 200 bits long. | There will be some ATPG constraints applied in these modes |
| FULL SCAN | —<br>Serial Interface | —<br>1 SI, 1 SO | 1 Fullscan chain that is little more than 24000 bits long (includes TDCD flops) | Like ALL SCAN mode |

Table 4 is a summary of various testmode control signals for a particular scan interface. The control signals are COMPRESSION_ENABLE, SPREADER_ENABLE, TDCD_ENABLE, AND TDCD_PARALLEL_ACCESS. These control signals can be internally or externally generated.

TABLE 4

| Testmodes | SCAN INTERFACES | COMPRESSION_ENABLE | SPREADER_ENABLE | TDCD_ENABLE | TDCD_PARALLEL_ACCESS |
|---|---|---|---|---|---|
| COMPRESSION_DECOMP_TDCD | Parallel | 1 | 1 | 1 | 1 |
| | Serial | 1 | 1 | 1 | 0 |
| COMPRESSION_TDCD | Parallel | 1 | 0 | 1 | 1 |
| | Serial | 1 | 0 | 1 | 0 |
| COMPRESSION_DECOMP | Parallel | 1 | 1 | 0 | X |
| | Serial | — | — | — | — |
| COMPRESSION | Parallel | 1 | 0 | 0 | X |
| | Serial | — | — | — | — |
| FULLSCAN | Parallel | 0 | 0 | 0 | X |
| | Serial | 0 | 0 | 0 | X |

The test generation program can generate two initialization sequence files for each TDCD testmode. The first sequence file builds the testmode for the parallel interface. TDCD_ENABLE is set to one. TDCD_PARALLEL_ACCESS is set to one. The second sequence program can be used in conjunction with serialized interfaces, and differs from the first sequence file in that TDCD_PARALLEL_ACCESS is set to zero, rather than one. Where a custom JTAG interface is used, the sequence files must be edited to match the custom hardware.

The logic generated as part of the flow can be tested when operating in non-TDCD testmodes. In this case, the TDCD registers and control logic can be added to the scan chains. Additionally the test generation program can perform structural checks to ensure that the TDCD descriptions are consistent.

Figure 8:
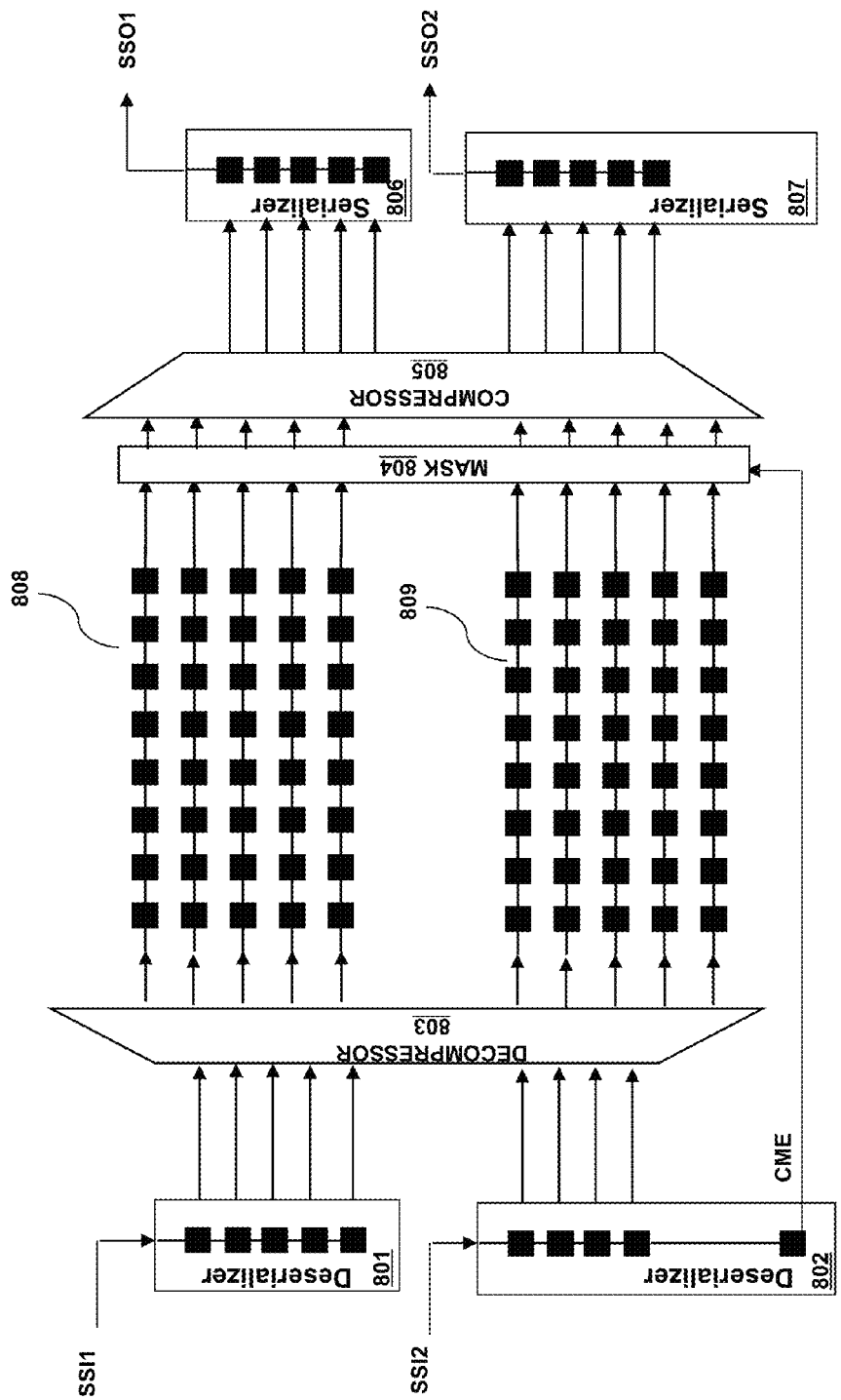
FIG. 8 illustrates a TDCD architecture having two serial inputs and two serial outputs.

In addition to the above-disclosed embodiments, TDCD architectures may have two or more serial inputs with two or more corresponding serial outputs. FIG. 8 illustrates the TDCD architecture according to an embodiment, where there are two serial inputs SSI1 and SSI2 and two serial outputs SSO1 and SSO2. Serial input SSI1 consists of five bits of test pattern data and is manipulated to a parallel signal by deserializer 801, which is received by the decompression circuitry of decompressor 803. The second serial input SSI2 consists of four bits of test pattern data and a mask enable bit. The test pattern bits are manipulated to a parallel signal by deserializer 802, and is received by the decompression circuitry of decompressor 803. The mask enable bit is transmitted to mask 804. Decompressor 803 generates the test patterns for scan chains 808 and 809 from the parallel nine bits of test pattern data. After masking, compressor 805 then compresses the scanned data into two parallel five-bit signals, the first received by serializer 806 and the second received by serializer 807. Each serializer then shifts out a serial signal, SSO1 and SSO2 respectively, over a serial pin.

Figure 9:
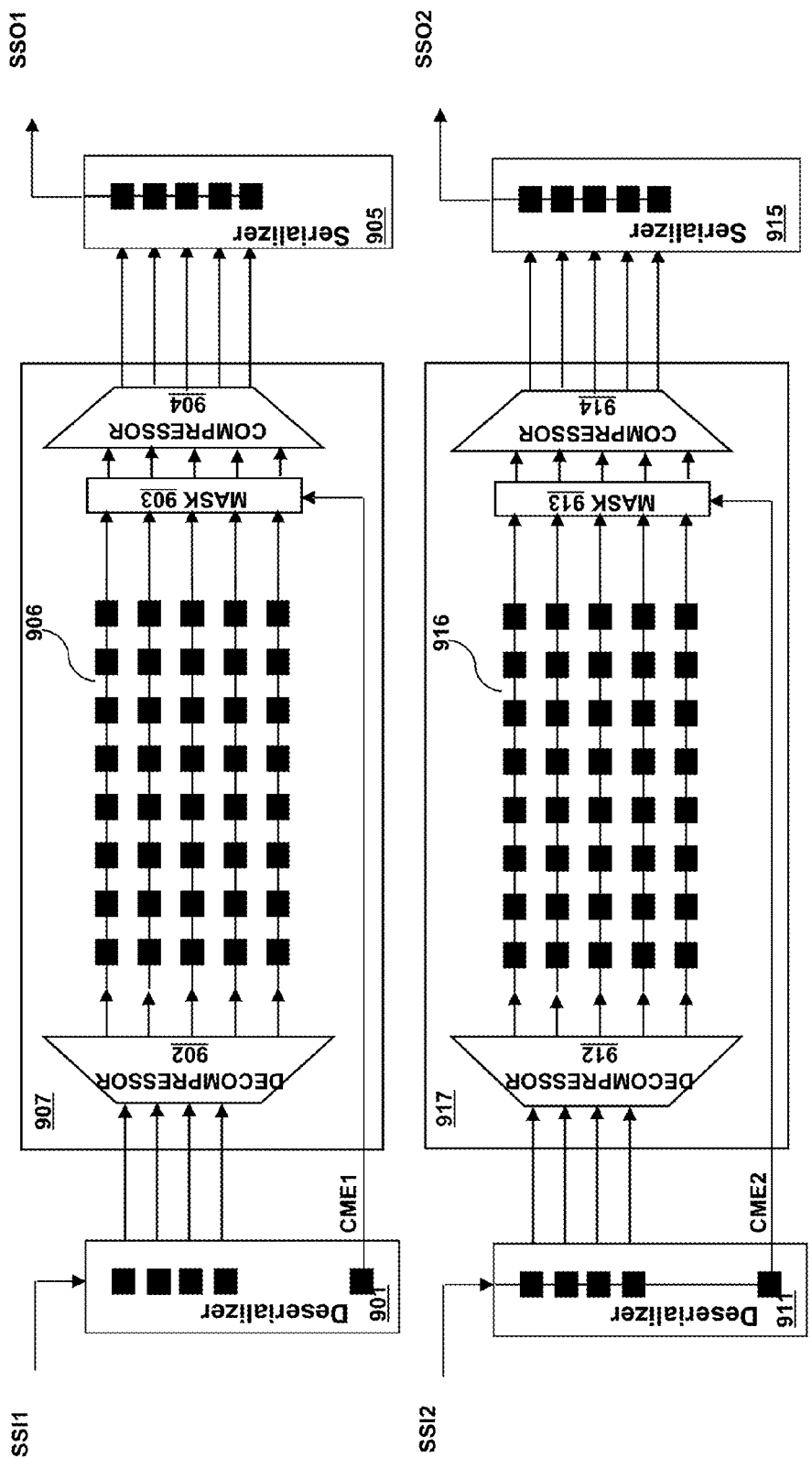
FIG. 9 illustrates a TDCD architecture having two serial inputs and two serial outputs having distinct decompressors, masks, and compressors.

FIG. 9 is an illustration of a TDCD architecture according to an embodiment having two serial inputs and two serial outputs, but having separate decompressor, mask, and compressor associated with each of the serial inputs and outputs. Each five-bit serial input signal, SSI1 and SSI2, have four bits of test pattern data and a mask bit, CME1 and CME2, respectively. In this embodiment, the path from serial input SSI1 through core 907 to serial output SSO1 proceeds in parallel with, but separately from the path from serial input SSI2 through core 917 to serial output SSO2.

Figure 10:
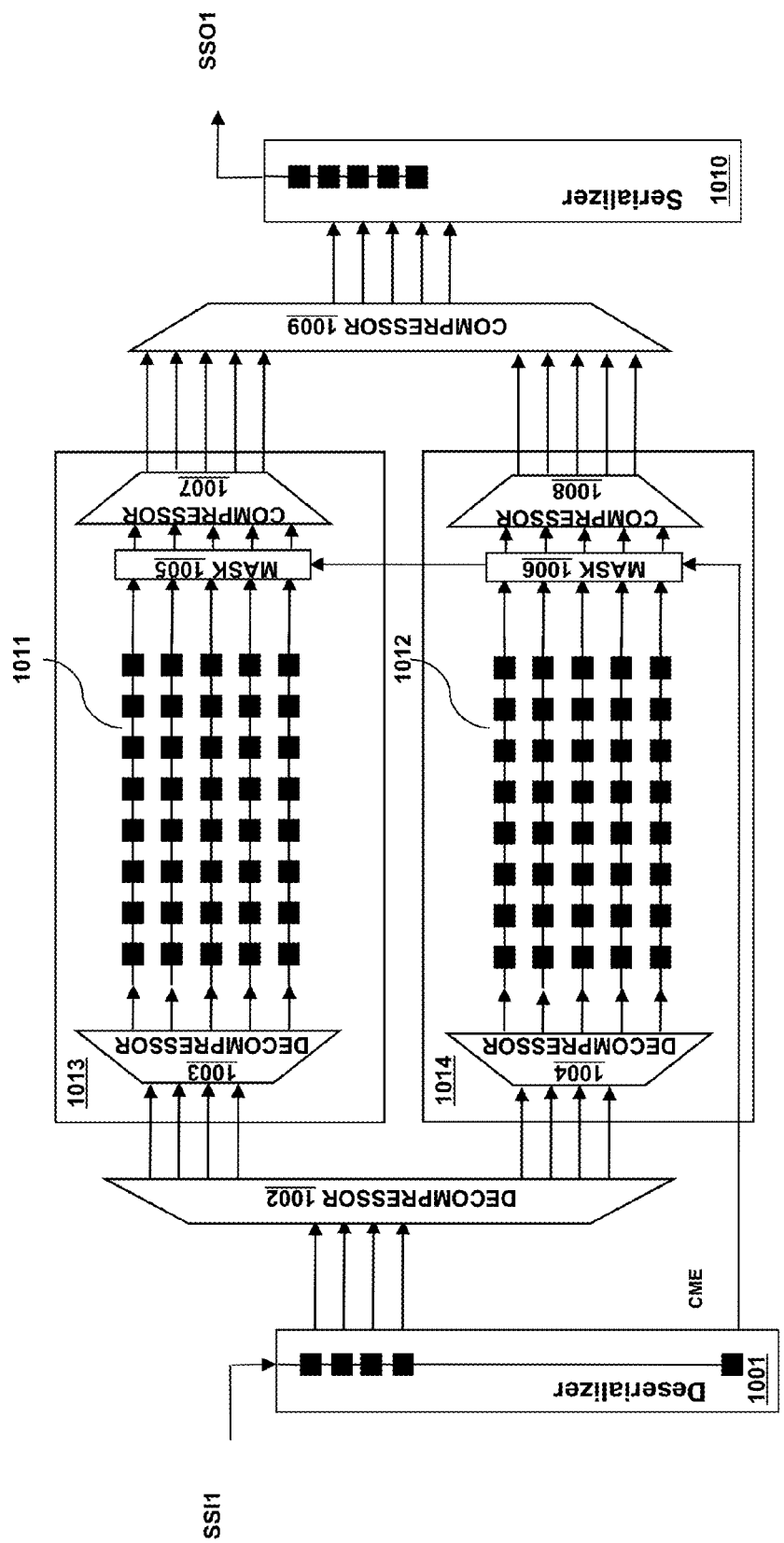
FIG. 10 illustrates a TDCD architecture having multiple cores, and a single serial input and a single serial output.

FIG. 10 is an illustration of another TDCD architecture according to an embodiment. In this embodiment, there is a single serial input SSI1 and a single serial output SSO2. Deserializer 1001 receives the shifted in five-bit signal, having four bits of data and one mask bit. The mask bit signal CME is transmitted to mask 1005 and mask 1006. The four bits of data are deserialized and transmitted to decompressor 1002 in parallel. Unlike the previous embodiments disclosed above, there are two-stages of decompression here. Decompressor 1002 manipulates the four-bit wide parallel signal received from deserializer 1001 into two sets of four parallel signal lines, each set received by one of decompressor 1003 or decompressor 1004. After scanning through scan chains 1011 and 1012 of cores 1013 and 1014, and having been masked, compressors 1007 and 1008 each manipulate their received signals into five-bit parallel signals that are transmitted to a second stage compressor 1009. Compressor 1009 converts the ten signals into a five-bit wide parallel signal that serializer 1010 shifts out as serial output signal SSO1.

This architecture allows for the performance of hierarchical test by simultaneously delivery patterns from a N-bit wide ATE interface to M-embedded cores, each of which has an N-bit wide scan interface. Here, test patterns from a 5-bit wide ATE interface are delivered simultaneously to 2 embedded cores 1013 and 1014. Thus, the core test patterns can be developed out-of-context without being constrained by the SoC or ATE interface restrictions.

As disclosed according to some of the above embodiments, for example as separately illustrated for FIGS. 8-10, five scan chains and five-bit deserializer and serializer are used. Greater or fewer numbers of scan chains may be used with five-bit serial inputs and outputs. Likewise, the serial inputs and outputs may be a value greater or less than five bits, although at least two are required. However, the macros used are the same width. Moreover, this architecture may be extended to additional serial inputs/outputs having a shared compressor, decompressor, and mask, along with additional corresponding scan chains. Additionally, FIGS. 8-10 show symmetry in the number of deserializers and serializers, and decompressors and compressors. However, asymmetry can also be supported. In such case, the number of deserializer may be different from the number of serializers, and/or the number of decompressors may be different from the number of compressors.

Figure 11:
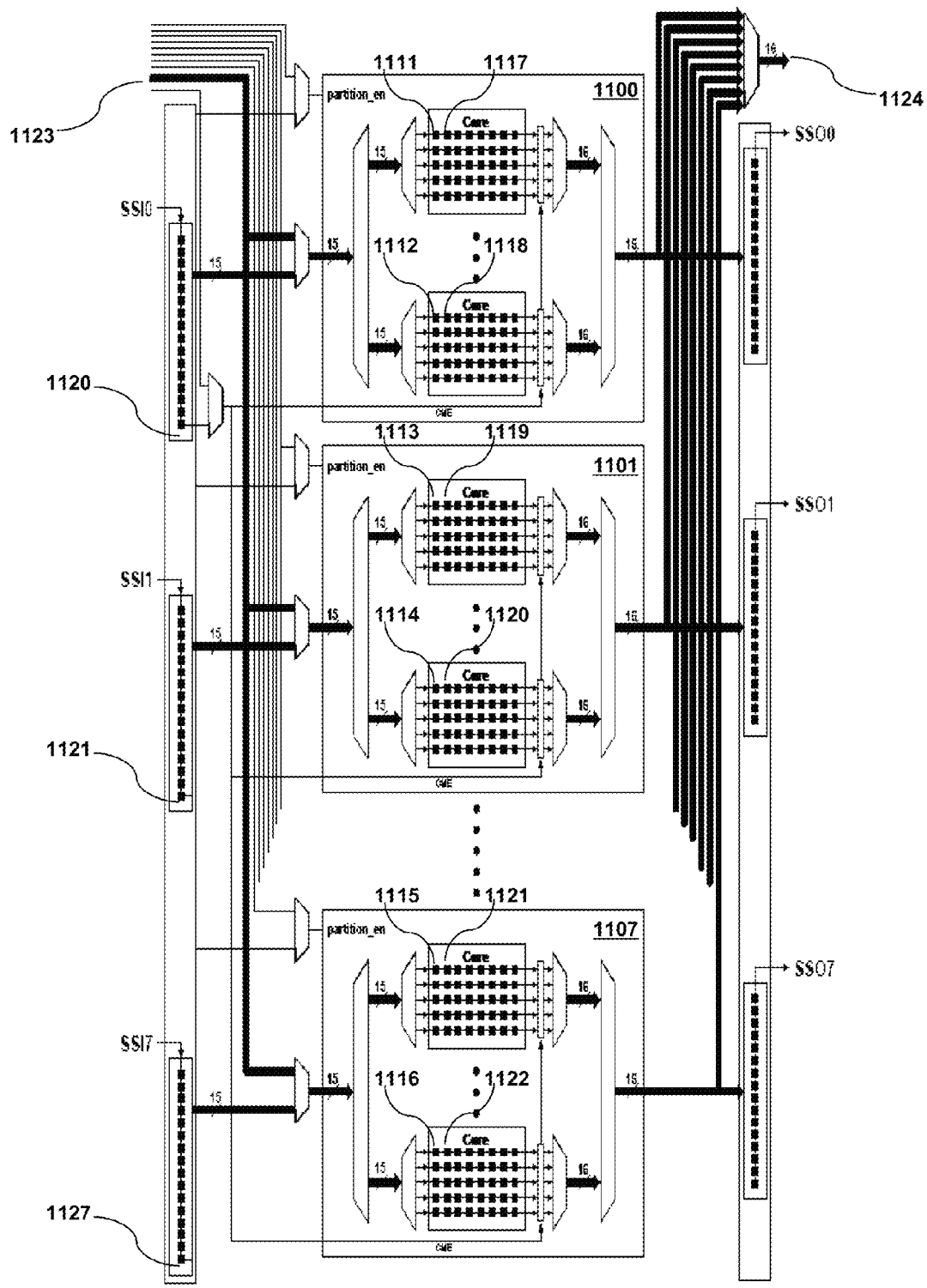
FIG. 11 is an illustration of a hierarchical TDCD architecture where the scan shift clocks may be interleaved.

In another embodiment a clock controller staggers clock signals in a staggered fashion so that the scan shifts of scan chains in different cores do not overlap. Instead the scan shift clocks are interleaved. One of the primary benefits of this architecture is that it helps meet low-power requirements by preventing the internal scan chains (cores) from all shifting simultaneously. This reduces instantaneous switching, and thus instantaneous power. These results are achieved without requiring additional test time for the clock staggering. This approach addresses global scan power issues, while existing ATPG technique can be further used to address localized power issues, for example within the cores. FIG. 11 is an illustration of a hierarchical TDCD architecture where the scan shift clocks may be interleaved. For ease of understanding, FIG. 11 is a simplified version instead of a full illustration.

In this embodiment, there are eight serial inputs SSI0 through SSI7 on the input side that shift bits into deserializers 1120 through 1127 respectively. Only SSI0, SSI1, and SSI7 are shown, along with the associated deserializers 1120, 1121, and 1127 respectively. Each deserializer includes an update stage that, when triggered by an update clock, triggers an update of the attached two-input muxes, whether two two-input muxes as for deserializer 1120, or a single two-input mux as for deserializers 1121 through 1127. There are eight corresponding serial outputs SSO0 through SSO7 on the output side. Only SSO0, SSO1, and SSO7 are shown. There is also a fifteen bit wide input parallel interface 1123 and a sixteen bit wide output parallel interface 1124. These parallel interfaces can be used in non-TDCD mode, where one partition at a time is accessed and tested. On the input side there are additional signal lines carrying the partition en signal to the partitions 1100 through 1107.

There are eight partitions, three of which are illustrated in FIG. 11: partitions 1100, 1101, and 1107. Each partition includes one or more cores of scan chains receiving test patterns. Each partition includes slices. The first slice of partition of 1100 is made up of the first registers in the scan chains of partition 1100, which includes the five registers 1111, and the five registers 1112, as well as the other unillustrated first registers in the scan chains of partition 1100. The second slice of partition of 1100 is made up of the second registers in the scan chains of partition 1100, which includes the five registers 1117, and the five registers 1118, as well as the other unillustrated second registers in the scan chains of partition 1100. And so on for the remaining six slices of the cores of partition 1100. Similarly, the first slice of partition 1101 includes first registers 1113 and 1114 (as well as the unillustrated first registers) and the second slice includes second registers 1119 and 1120 (as well as the unillustrated second registers). And so on for each of the remaining partitions.

To interleave the scan shifting, multiple internal shift clocks are generated, such that they pulse in a staggered fashion. As a result, the first slice of partition 1100 will shift first. Second, the first slice of partition 1101 will shift. The first slices of the next five partitions will then shift sequentially, followed eighth by the first slice of partition 1107. Having completed the first cycle, the process repeats for the second slices of partitions, 1100 to 1107, beginning with the second slice of partition 1100. This process repeats until all the cores have completed shifting through the longest of the scan chains.

Figure 12:
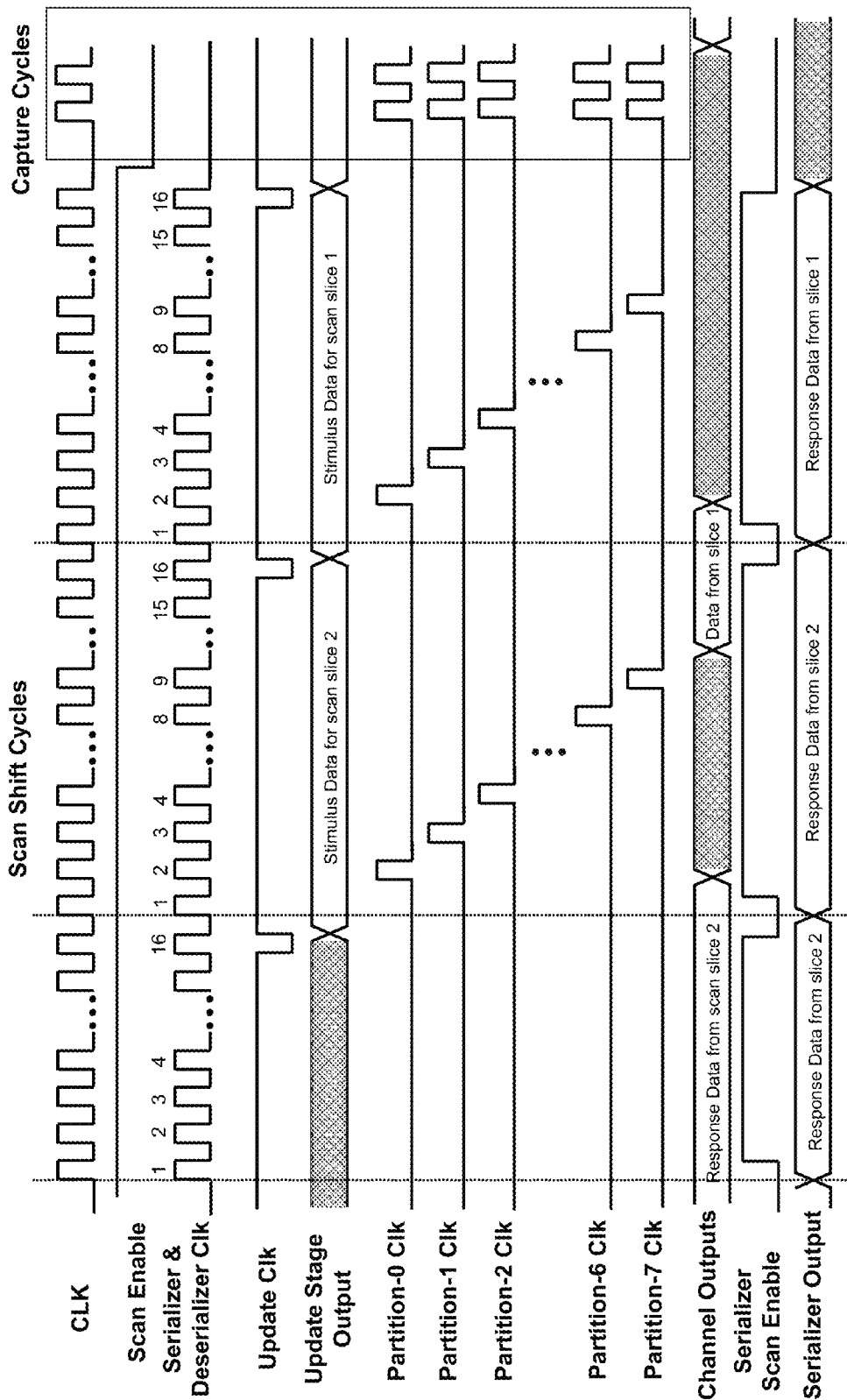
FIG. 12 illustrates waveforms in a timing diagram for a hierarchical TDCD architecture where the scan shift clocks may be interleaved.

FIG. 12 is a timing diagram illustrating the waveforms of selected signals of an interleaved architecture similar to that described above and illustrated in FIG. 11. However, this timing diagram is illustrated for a deserializer that is sixteen bits wide as in FIG. 11, but where the scan chains are only two bits long. Therefore there are only two scan slices per partition, rather than eight. Each of the either partition clock signals, Partition-0 Clk through Partition-7 Clk, consist of pulses that are timed to sequentially pulse the first slices of each partition sequentially, followed by the second slices of each partition, during the scan shift cycle.

According to an embodiment, a three-pin digital interface allows for fullscan/bypass test generation, compression test generation with masking, on-chip clock, and memory-built-in-self-test and logic-built-in-self-test using direct access mechanisms. A user would proceed through ATPG in the normal course, and then map these results to a three-pin architecture. The three pins may be at the chip level, the package level, or both. As a tradeoff for a fewer number of pins, this approach may sometimes lead to longer test application times.

Table 5 lists the external pins of the three-pin interface: two input pins, Data/Control 1301 and Clock 1302, and an Output Pin 1303. Table 5 also lists internal pin connections

TABLE 5

| External Pins | Internal Pins |
| --- | --- |
| Data/Control | Scan Enable |
| Clock | Scan Chains Inputs [0:N] |
| Output | System/Scan Clock |
| | Channel Mask Enable |
| | System Reset Clock |
| | Reset/Set Clocks |
| | CG Load Data [0:N] |
| | CG Load Clock |
| | CG Trigger |
| | Mask Load Data [0:N] |
| | Mask Load Clock |
| | Custom TDR Data [0:N] |
| | Custom TDR Clock |

Because only three pins are used, every ATPG actions requests the correct states are loaded for an action to occur. States are provided that allow these actions to occur. Mask Load loads the mask registers. CG Load loads the clock generation (CG) registers. Reset/Set Clocks allows for the reset/set of logic testing. CG Trigger is used for CG operations. The measure data states allows the scan outputs to be measured outside of scan. The set data state allows serial inputs to be set outside of scan, which is a frequent action by ATPG. Furthermore, a reset pulse may be used to initialize the design.

Figure 13:
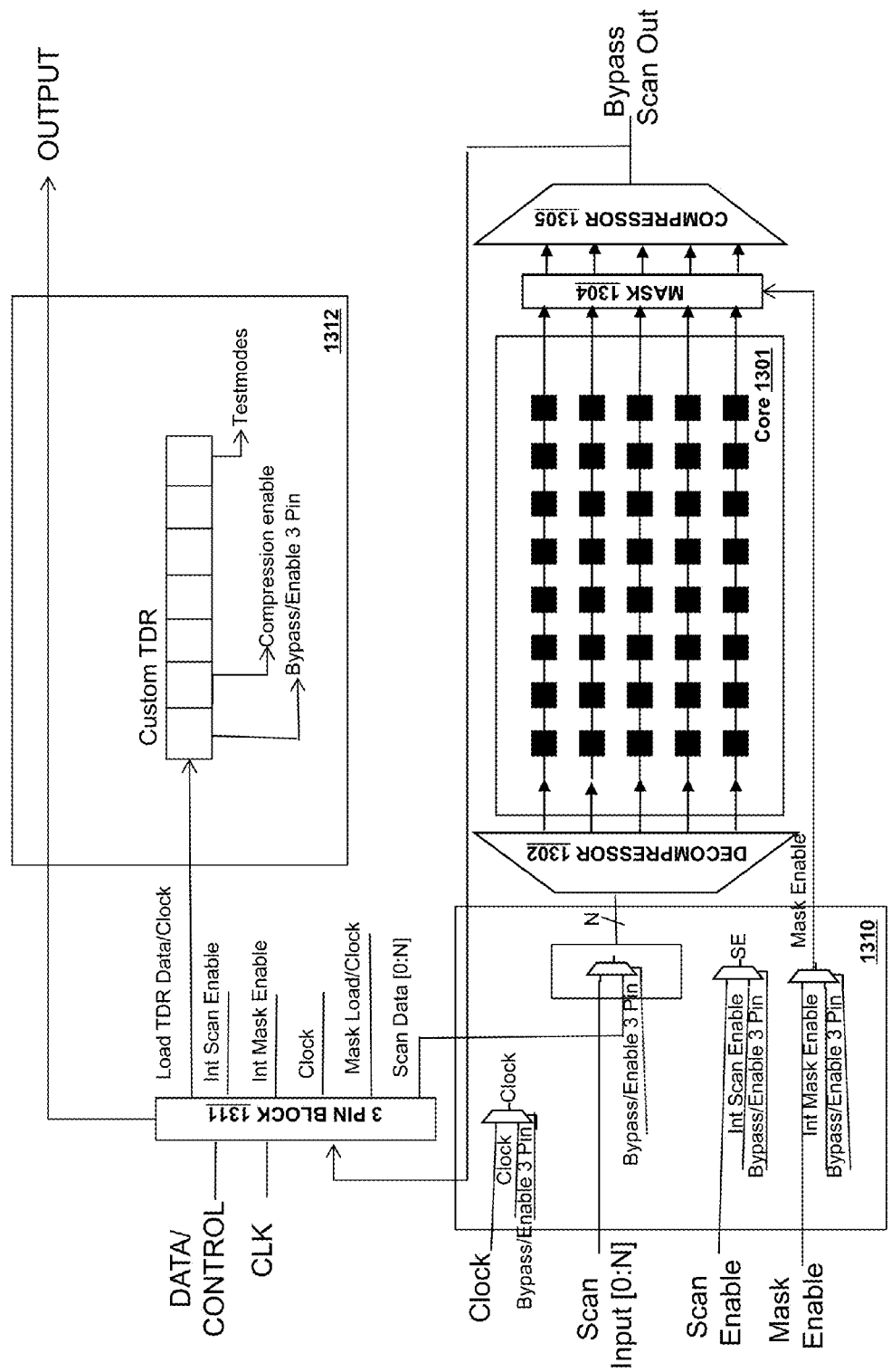
FIG. 13 is an illustration of functional blocks and circuits inserted into a circuit design in a three-pin TDCD test architecture.

FIG. 13 is an illustration of the blocks inserted in a circuit design according to this embodiment. The three-pin macro 1311 is inserted, along with mux control logic 1310, and a three pin TDR 1312, into the circuit design. Decompressor 1302 manipulates the parallel input into the scan chains of core 1301, here having three-hundred thirty internal scan chains. The results are masked at mask 1304, and manipulated by compressor 1305, the data returned to the three pin block 1311.

In a functional model, the Data/Control pin is held at a value of "1", forcing the three pin interface to be reset and out of the way of system logic. The Bypass/Enable 3 Pin signal line controls the muxes of the mux control logic block 1310. When doing test generation, user would bypass the three-pin interface to allow traditional automatic test pattern generation (ATPG tools). By bypassing the logic, the ATPG tools do not have to understand the three pin design and can continue to work without modification. In that case, ATPG signals Clock, Scan Input [0:N], Scan Enable and Mask Enable are applied directly, and the output scanned out from compressor 1305, bypassing three-pin block 1311.

In logic test, users can load the three pin TDR 1312 to select if they want to use direct pin control, or the three pin interface. Once test patterns have been generated, the patterns are mapped into the three pins by serializing the input/output values and using the pre-defined state machine values. The ability to map the patterns allows for pattern re-use. In some designs the wafer and package dies have different pin requirements. At the chip wafer, there may be the ability to do a full-pin test suite, in which case the original ATPG patterns may be used. At the packages level, the same patterns may be applied, but instead using the three-pin interface. This allows the same faults to be tested at both the wafer and package levels.

Figure 14:
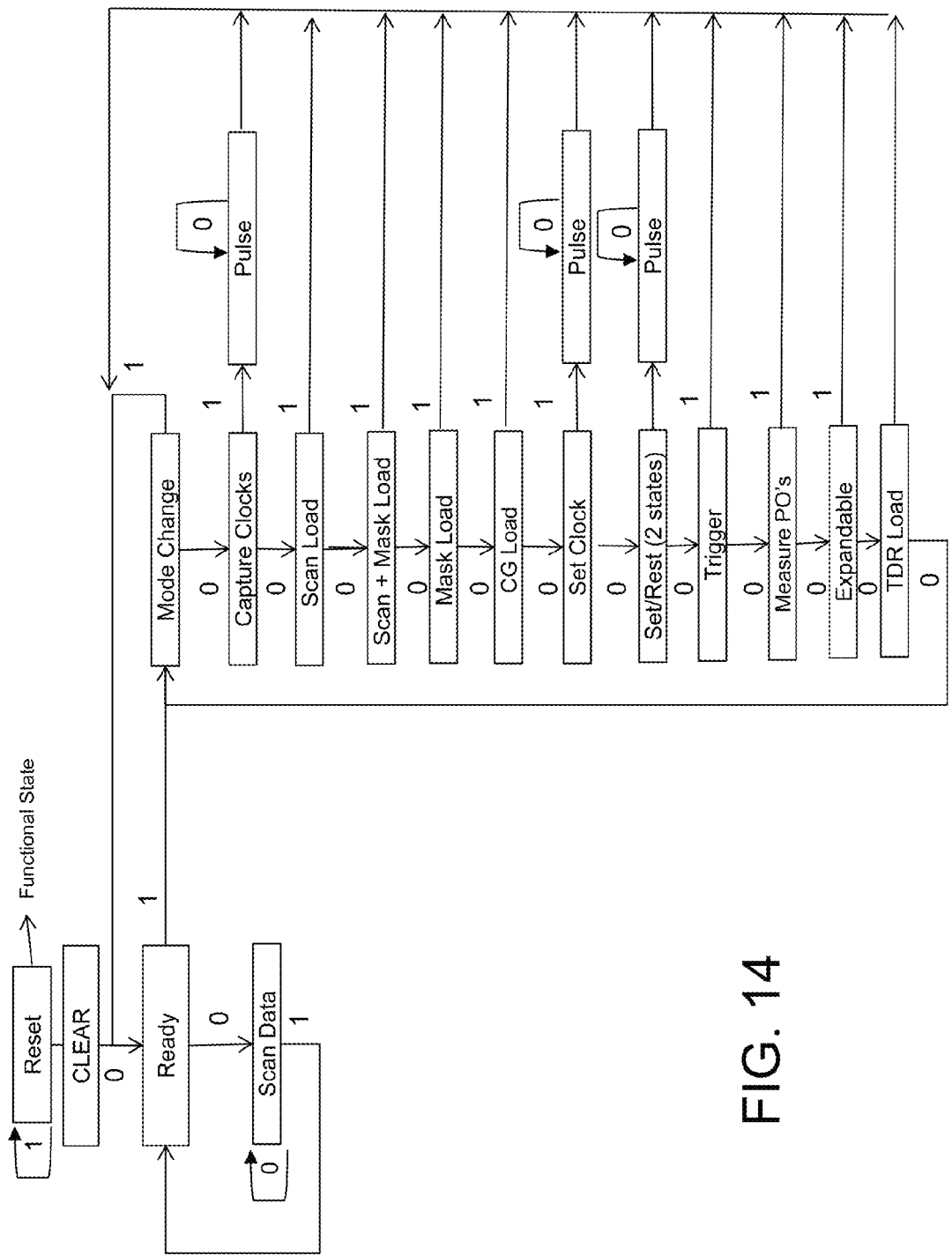
FIG. 14 is an illustration of a state machine in three-pin test architecture.

FIG. 14 is a state machine according to an embodiment. This state machine allows for regular fullscan, compression with masking, on-product clock generation (OPCG), and set/reset clock pulses all from the three pin interface. The state machine is expandable to allow for more or fewer states based on the desired test suite. Te current state machine state determines what actions will occur on the internal logic. For example, when the Scan_Load state has been selected the Scan_Enable pin to the internal logic is turned "on." The three pin interface can now move the Scan_Data state to load values on the scan chains and also measure the prior values of the scan chains on the "out" pin. The serializing allows for the entire scan data to be stimmed and measured. The state machine also defines different states for clocks, mask load (for when masking and compression is used) and other clocking states with their own unique pin interactions and values.

An example of loading and measuring scan data using the three pin state machine in an embodiment follows. In this example, there is a four-scan chain input/output. As a starting point, the three pin interface is active and loaded and in the Ready state. The DATA/CONTROL pin is stimmed to one, and the CLK pulsed, moving the state to Mode Change state. Stim DATA/CONTROL=0, pulse CLK moves the state from Mode Change to Capture Clocks state. Stim DATA/CONTROL=0, pulse CLK moves the state to Scan Load state. Stim DATA/CONTROL=1, pulse CLK moves the state to the Ready state. Scan Enable output of the three pin interface is set "on." Stim DATA/CONTROL=0, pulse CLK moves the state to the Scan Data state. Stim DATA/CONTROL=0, pulse CLK informs Scan Data that the next event is data.

Now that the state machine is in the Scan Data state, data may now be loaded and unloaded. One bit of data is shifted out and measured. Stim DATA/CONTROL=0, measure OUTPUT, and pulse CLK, a value of "0" is placed on the first chain input, and the value on the output of the first chain is measured. Stim DATA/CONTROL=1, measure OUTPUT, and pulse CLK, a value of "1" is placed on the second chain input, and the value on the second output chain is measured. Stim DATA/CONTROL=0, measure OUTPUT, and pulse CLK, a value of "0" is placed on the third chain input, and the value on the third output chain is measured. Stim DATA/CONTROL=0, measure OUTPUT, and pulse CLK, a value of "0" is placed on the fourth chain input, and the value on the fourth output chain is measured. Stim DATA/CONTROL=0, pulse CLK pulses the internal scan clock, and the valued placed on the scan inputs are captured into the system. If more data to load is now available, stim DATA/CONTROL=0, pulse CLK tells the interface to expect more data. If all scan data is loaded/uploaded, stim DATA/CONTROL=1, pulse CLK returns to the Ready state. This process is repeated for all bits in the scan chain.

The same processing works for compression data, but the first data loaded represents the masking data, which is then followed by the stim/measure of the remaining data. For system (non-scan) operations, moving and selecting other states will turn on/off the needed internal control signals. The three pin state machine uses the knowledge of the current and prior states to define what operation to perform. Given a current and prior state, the value found on DATA/CONTROL pin will define what internal action will be performed. This might be moving to a new state of propagating a value into the internal logic.

The state machine is reset by holding the DATA/CONTROL pin to "1" for a predefined number of CLK pulses. This allows the state machine to return to a known state at any time, with a consistent clocking event. The state machine is designed such that there is never time when the DATA/CONTROL signal will be at "1" for the predefined reset count during normal state machine operation. The number of pulses needed to reset the macro limits the number of internal scan chains that can be present. If the reset is set to occur on the tenth pulse, the maximum number of scan chain inputs in the non-three state mode is nine. This limitation is due to the scan data being serialized from nine chains down to one data pin. The three pin interface will transform the inputs from the single pin into nine internal chains. If there were ten or more scan chains, the conversion of data into the three pin interface could force a "1" value to occur on the ten scan input pins, forcing the macro to reset, and causing future actions to fail due to the state machine being in the wrong state.

There are many benefits to the described approach. Reducing the number of available digital test pins allows for the use of packages having fewer numbers of pins. Fewer test pins also allows the use of smaller, less expensive testers. A traditional test methodology can also be migrated over to the three pin approach, resulting in more consistent and known test results. Test patterns may also be reused where the chip wafer has a different test pin interface than the package. For example, the wafer may use a full set of test pins, which may be upwards of sixteen pins or more. On-product testing is also allowed, which can minimize high speed pin contacts. The package, on the other hand, may use only three pins, but may still allow a full test suite to run on the chip. Likewise, standard diagnostic capabilities may be used. This approach allows for the use of compression technologies and supports X-masking. Furthermore, the disclosed state machine can be grown to add new technologies as they are introduced in future test tools.

Figure 15:
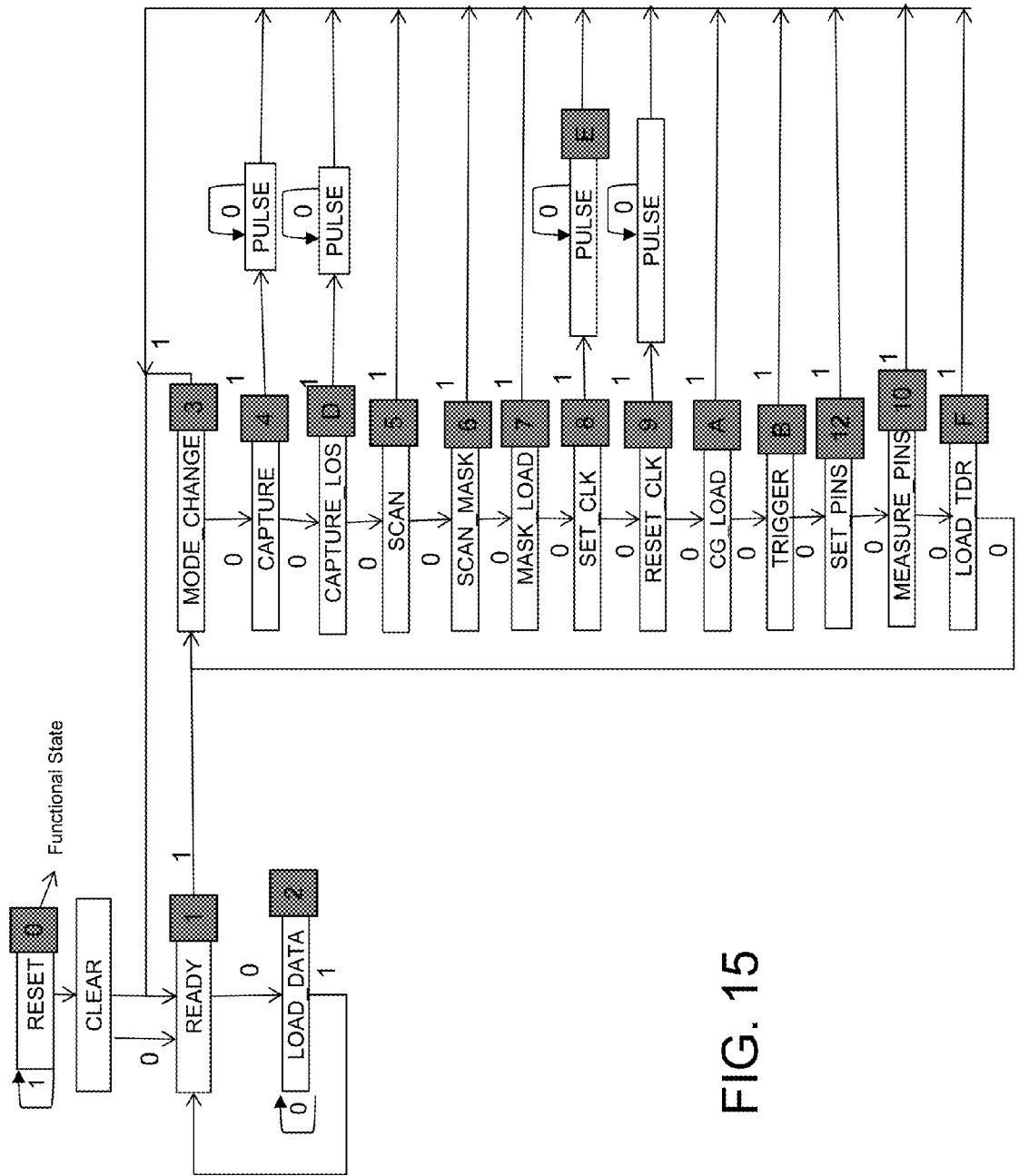
FIG. 15 is an illustration of a state machine in three-pin test architecture.
Figure 16A:
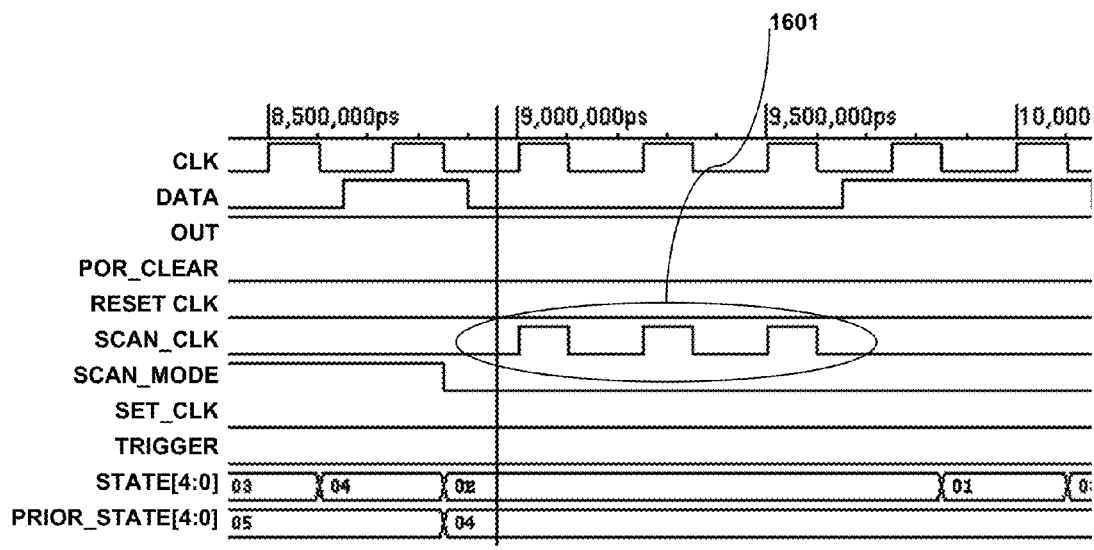
FIGS. 16A and 16B illustrate the waveforms of selected pins of three-pin test architecture.
Figure 16B:
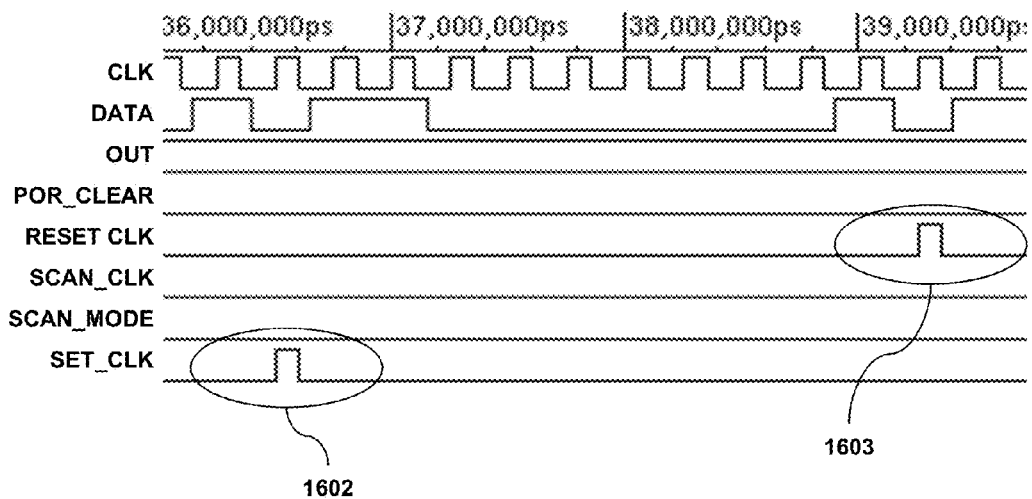

FIG. 15 is an illustration of an implementation three-pin control interface according to an embodiment. Once the CAPTURE/SET_CLK/RESET_CLK state is selected, the state machine of the controller goes into a PULSE state. When in PULSE, a "0" value on data allows a clock pulse to the logic. As an example, four sequential 0's followed by pulses allow four pulses to go to the logic. If a "1" value is then present on the DATA line, then no pulses are sent and the controller goes out of the PULSE state. FIG. 16A illustrates waveforms according to an embodiment. Pulses 1601 are three capture pulses of SCAN CLK. FIG. 16B illustrates the pulsing 1602 of the set clock SET_CLK and the pulsing of the reset clock RESET_CLK 1603.

During scan data loading and measurement, once the SCAN state is selected, TDR needs to move to the LOAD_DATA state. The SCAN state moves to the READY state, which forces the scan en signal to go high. In the LOAD_DATA state, a "0" value on the data line for the first pulse identifies that scan data is to follow on the serial connection. The scan data that follows depends on the scan width. As an example, if the scan width is four, a "0" pulse, followed by four sequential data bits followed by pulses, results in data at signal scan_data[0:3] of those four data bits. Note that N is three in scan_data[0:N] here because the scan width is four. This example is one shift of the scan chain. To measure/stim the next bit, a "0" pulse is reapplied. However, if the scan is done, a "1" pulse is applied, moving the state machine back to the READY state for the next processing.

Figure 17:
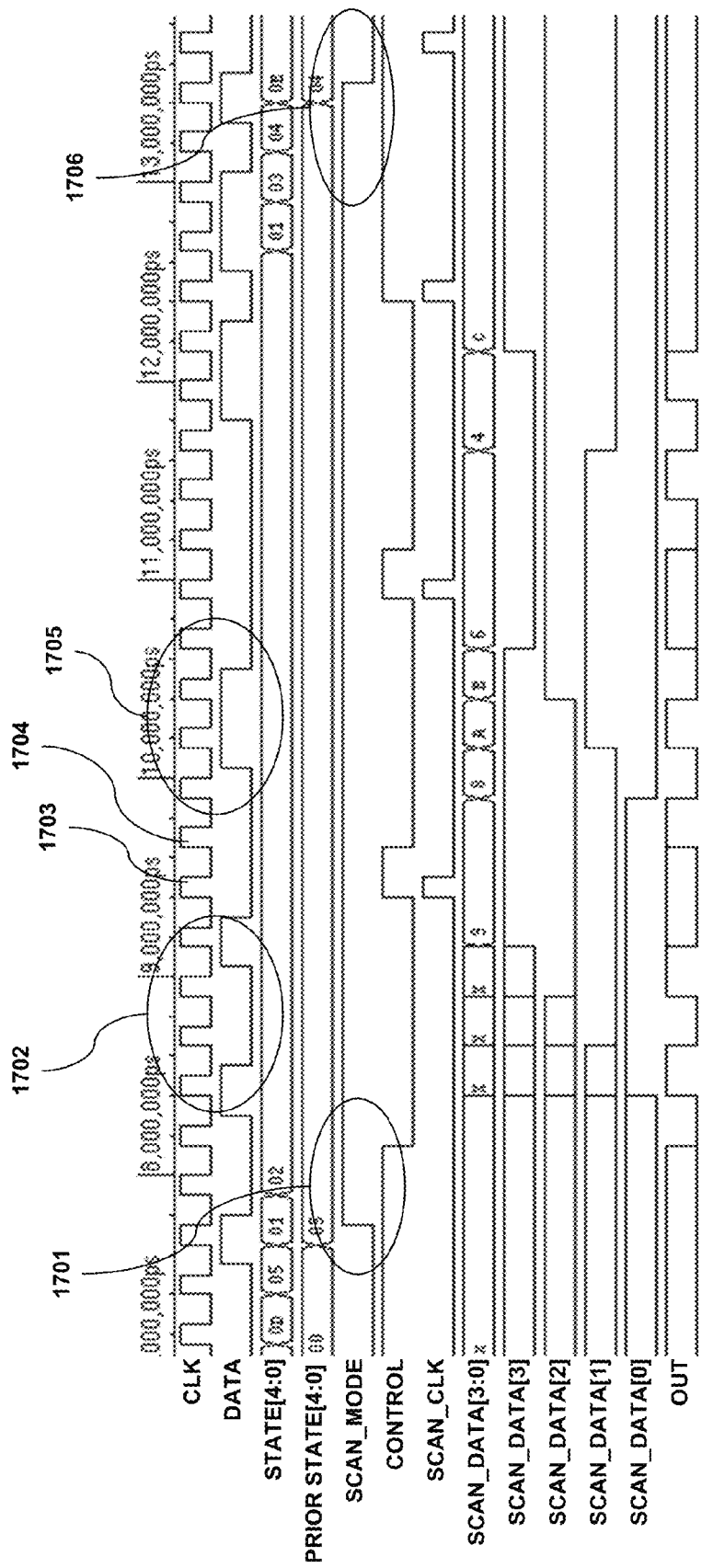
FIG. 17 illustrates the waveforms of a scan data example in three-pin test architecture.

FIG. 17 illustrates the waveforms of a scan data example in a three-pin test architecture according to an embodiment, with four scan chains that are three bits in length. Here there is loaded the first bits to the scan chain of "1001," followed by "0101." At 1701, scan mode is entered. At 1702, the first clock of scan data is received. No internal scan clock is seen. At 1703, at the time of the fifth clock pulse, data is presented to the inside logic and the internal scan chain clock pulses. At 1704, the data bit a 0, and the pulse clock stays in the state expecting further data for the second bit of the four scan chains. At 1705 scan data is loaded. After the third bit of the four scan chains is loaded, at 1706 the scan mode is left, and the CAPTURE state reentered.

Figure 18:
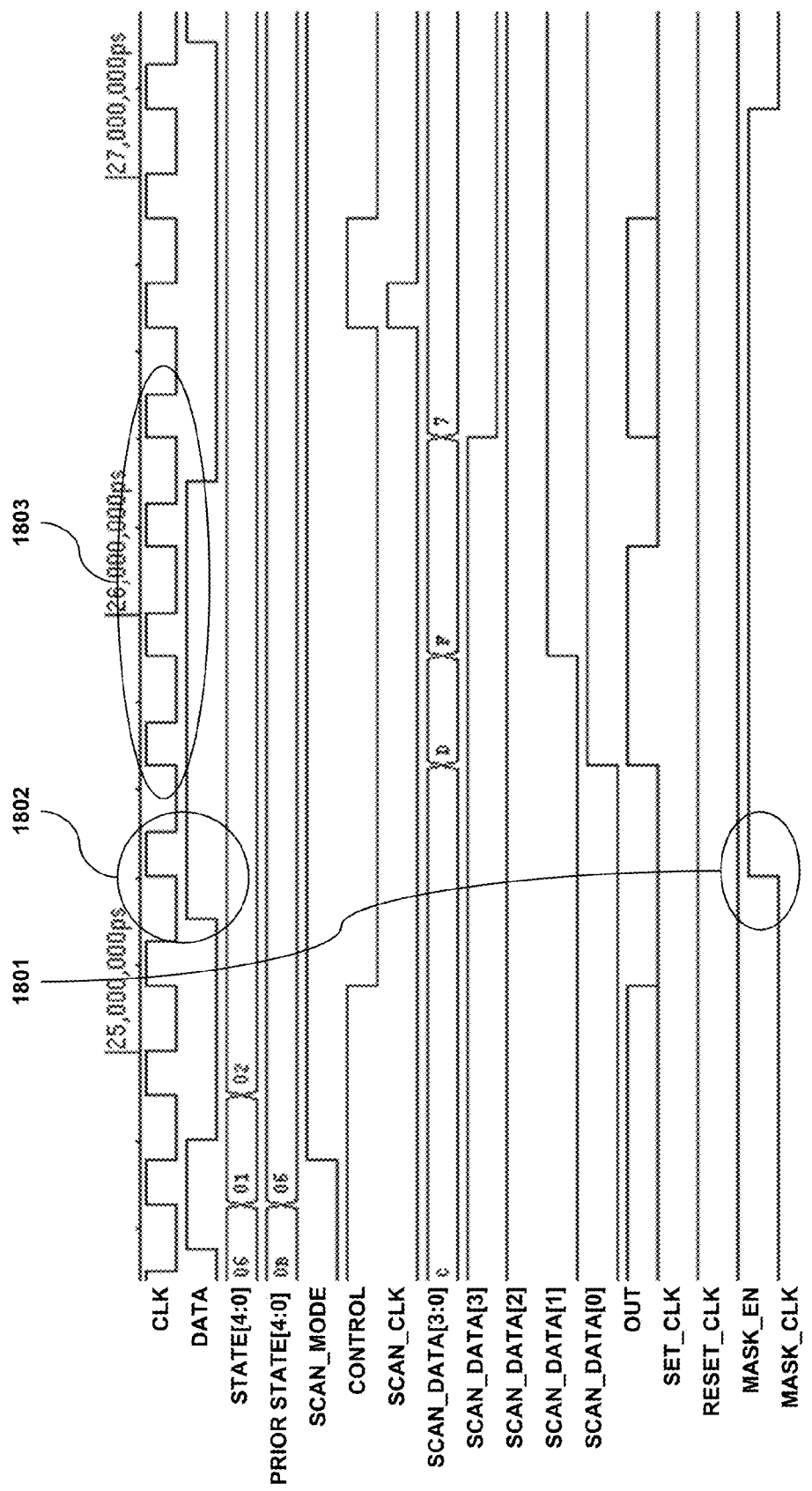
FIG. 18 illustrates the waveforms of a compression and scan data example in three-pin test architecture.

According to another embodiment, during compression and scan, a mask enable value is used in addition to the scan data loading and measurement procedure. FIG. 18 illustrates the waveforms according to this embodiment. In addition to the scan data, a mask enable value follows the four bits of the scan width. As a result scan_data[0:3] may have the value "1011" as above, but is preceded by mask_en with value "1." FIG. 18 illustrates the compression and scan with the mask bit 1801 at shift cycle 1802. Four bits of scan data 1803 then follow.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method of generating scan test circuitry for insertion into an integrated circuit design, comprising:

receiving an integrated circuit design for storage in a memory;

instantiating in the integrated circuit design a first input pin to serially transport both scan data and a plurality of control bits, a clock pin, an output pin, a plurality of cores comprising a plurality of scan chain registers, and a state machine controller adapted for three external test pins and electrically connected to the plurality of scan chain registers, the first input pin, the clock pin, and the output pin;

configuring the state machine controller to selectively direct, according to a control bit of the plurality of control bits to be received at the first input pin, one of the scan data to be received from the first input pin to the plurality of scan chains and the scan data to be received from a second input pin to the plurality of scan chains, wherein the scan data to be received at the first input pin and the scan data to be received from the second input pin each comprise the same test patterns to be shifted in the plurality of scan chain registers during a scan test; and configuring the state machine controller to generate a plurality of scan clocks to pulse the plurality of scan chain registers during a scan testing to shift scan data in the plurality of scan chain registers.

2. The method of claim 1, further comprising:
instantiating in the integrated circuit design a mask register to receive a mask bit signal and to mask an output from the plurality of scan chains; and
configuring the state machine controller to output the mask bit signal.

3. The method of claim 1, wherein the plurality of scan clocks will be interleaved to sequentially shift the scan data in the plurality of scan chain registers of the plurality of cores.

4. The method of claim 3, wherein the scan data in the plurality of scan chain registers of a core of the plurality of cores will be shifted independently in time from the plurality of scan chain registers of another core of the plurality of cores.

5. The method of claim 1, wherein the state machine controller is configured to provide states to enable an on-product clock generation.

6. The method of claim 1, wherein the plurality of cores are arranged in a hierarchy.

7. The method of claim 1, wherein the state machine controller is configured to reset after receiving a number of pulses greater than a number of the scan chain registers.

8. The method of claim 1, wherein the state machine controller is programmable during operation.

9. A computer-readable non-transitory storage medium having stored thereon a plurality of instructions, the plurality of instructions, when executed by a computer, cause the computer to perform:
receiving an integrated circuit design for storage in a memory;
instantiating in the integrated circuit design a first input pin to serially transport both scan data and a plurality of control bits, a clock pin, an output pin, a plurality of cores comprising a plurality of scan chains having a plurality of scan chain registers, and a state machine controller adapted for three external test pins and electrically connected to the plurality of scan chain registers, the first input pin, the clock pin, and the output pin;
configuring the state machine controller to selectively direct, according to a control bit of the plurality of control bits to be received at the first input pin, one of the scan data to be received from the first input pin to the plurality of scan chains and the scan data to be received from a second input pin to the plurality of scan chains, wherein the scan data to be received at the first input pin and the scan data to be received from the second input pin each comprise the same test patterns to be shifted in the plurality of scan chain registers during a scan test; and
configuring the state machine controller to generate a plurality of scan clocks to pulse the plurality of scan chain registers during a scan testing to shift scan data in the plurality of scan chain registers.

10. The computer-readable non-transitory storage medium of claim 9, the plurality of instructions, when executed by a computer, cause the computer to further perform:
instantiating in the integrated circuit design a mask register to receive a mask bit signal and to mask an output from the plurality of scan chains; and
configuring the state machine controller to output the mask bit signal.

11. The computer-readable non-transitory storage medium of claim 9, wherein the plurality of scan clocks will be interleaved to sequentially shift the scan data in the plurality of scan chain registers of the plurality of cores.

12. The computer-readable non-transitory storage medium of claim 11, wherein the scan data in the plurality of scan chain registers of a core of the plurality of cores will be shifted independently in time from the plurality of scan chain registers of another core of the plurality of cores.

13. The computer-readable non-transitory storage medium of claim 9, wherein the state machine controller is configured to provide states to enable an on-product clock generation.

14. The computer-readable non-transitory storage medium of claim 9, wherein the plurality of cores are arranged in a hierarchy.

15. The computer-readable non-transitory storage medium of claim 9, wherein the state machine is configured to reset after receiving a number of pulses greater than a number of the scan chain registers.

16. The computer-readable non-transitory storage medium of claim 9, wherein the state machine controller is programmable during operation.

17. An apparatus for scan testing an integrated circuit, comprising:
a plurality of cores comprising a plurality of scan chains having a plurality of scan chain registers;
a first set of test pins comprising a first input pin to serially transport both scan data and a plurality of control bits, a clock pin, and an output pin, wherein the scan data comprises test patterns to be shifted in a plurality of scan chain registers during a scan test of the integrated circuit;
a second set of test pins comprising a second input pin to transport the scan data and a control pin; and
a state machine controller adapted for the first set of test pins and electrically connected to the plurality of scan chain registers, the first input pin, the clock pin, and the output pin,
wherein the state machine controller is configured to selectively direct, according to a control bit of the plurality of control bits to be received at the first input pin, one of the scan data to be received from the first input pin to the plurality of scan chains and the scan data to be received from the second input pin to the plurality of scan chains, and
wherein the state machine controller is configured to generate a plurality of scan clocks to pulse the plurality of scan chain registers during the scan testing to shift the scan data in the plurality of scan chain registers.

18. The apparatus for scan testing an integrated circuit of claim 17, further comprising a mask register to receive a mask bit signal and to mask an output from the plurality of scan chains, and wherein the state machine controller is configured to output the mask bit signal.

19. The apparatus for scan testing an integrated circuit of claim 17, wherein the plurality of scan clocks are interleaved to sequentially shift the scan data in the plurality of scan chain registers of the plurality of cores.

20. The apparatus for scan testing an integrated circuit of claim 19, wherein the scan data in the plurality of scan chain registers of a core of the plurality of cores are shifted independently in time from the plurality of scan chain registers of another core of the plurality of cores.

21. The apparatus for scan testing an integrated circuit of claim 17, wherein the state machine controller provides states to enable an on-product clock generation.

22. The apparatus for scan testing an integrated circuit of claim 17, wherein the plurality of cores are arranged in a hierarchy.

23. The apparatus for scan testing an integrated circuit of claim 17, wherein the state machine is configured to reset after receiving a number of pulses greater than a number of the scan chain registers.

24. The apparatus for scan testing an integrated circuit of claim 17, wherein the state machine controller is programmable during operation.

* * * * *